(12) United States Patent
Ha et al.

(10) Patent No.: US 10,997,021 B2
(45) Date of Patent: May 4, 2021

(54) LDPC DECODER, SEMICONDUCTOR MEMORY SYSTEM AND OPERATING METHOD THEREOF

(71) Applicants: SK hynix Inc., Gyeonggi-do (KR); Korea Advanced Institute of Science and Technology, Daejeon (KR)

(72) Inventors: Jeong-Seok Ha, Daejeon (KR); Seok-Ju Han, Seoul (KR); Ji-Eun Oh, Daejeon (KR)

(73) Assignees: SK hynix Inc., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 16/691,278

(22) Filed: Nov. 21, 2019

(65) Prior Publication Data

US 2020/0218607 A1 Jul. 9, 2020

(30) Foreign Application Priority Data

Jan. 9, 2019 (KR) .......................... 10-2019-0002635

(51) Int. Cl.
  *H03M 13/00* (2006.01)
  *G06F 11/10* (2006.01)
  *H03M 13/11* (2006.01)

(52) U.S. Cl.
  CPC ..... *G06F 11/1068* (2013.01); *H03M 13/1125* (2013.01)

(58) Field of Classification Search
  None
  See application file for complete search history.

(56) References Cited

U.S. PATENT DOCUMENTS

| | | | |
|---|---|---|---|
| 9,977,713 B2 | 5/2018 | Kang et al. | |
| 2005/0204272 A1* | 9/2005 | Yamagishi | H03M 13/6577 714/801 |
| 2010/0162075 A1* | 6/2010 | Brannstrom | H04L 1/06 714/752 |
| 2011/0231731 A1* | 9/2011 | Gross | H03M 13/658 714/760 |
| 2014/0053037 A1* | 2/2014 | Wang | H03M 13/13 714/752 |

(Continued)

FOREIGN PATENT DOCUMENTS

KR  10-1482824  1/2015

*Primary Examiner* — Mujtaba M Chaudry
(74) *Attorney, Agent, or Firm* — IP & T Group LLP

(57) ABSTRACT

A semiconductor memory system including: a semiconductor memory device suitable for storing a codeword; and an LDPC decoder suitable for decoding the codeword to generate decoded data, wherein the LDPC decoder includes: a message passing decoding component suitable for performing a first decoding operation of decoding the codeword, and calculating the minimum value among numbers of UCNs; and an error path detection component suitable for detecting error path candidates using a tree in which each of UCNs corresponding to the minimum value is set to a root node, sorting the detected error path candidates in ascending order of maximum LLRs, resetting symbol values and LLRs of variable nodes in the error path candidates, and providing the message passing decoding unit with information on the reset symbol values and LLRs.

20 Claims, 21 Drawing Sheets

(56) References Cited

U.S. PATENT DOCUMENTS

| | | | |
|---|---|---|---|
| 2014/0101510 A1* | 4/2014 | Wang | H03M 13/1117 |
| | | | 714/758 |
| 2014/0201594 A1* | 7/2014 | Zhu | H03M 13/1137 |
| | | | 714/758 |
| 2018/0041227 A1* | 2/2018 | Lee | H03M 13/2948 |
| 2020/0082251 A1* | 3/2020 | Cherubini | G06N 3/084 |

* cited by examiner

- After 1 iteration
v = ( 0  1  1  0  1  0  0  0  1  1 )

$$H\underline{v}^t = \begin{pmatrix} 1 & 1 & 1 & 1 & 0 & 0 & 0 & 0 & 0 & 0 \\ 1 & 0 & 0 & 0 & 1 & 1 & 1 & 0 & 0 & 0 \\ 0 & 1 & 0 & 0 & 1 & 0 & 0 & 1 & 1 & 0 \\ 0 & 0 & 1 & 0 & 0 & 1 & 0 & 1 & 0 & 1 \\ 0 & 0 & 0 & 1 & 0 & 0 & 1 & 0 & 1 & 1 \end{pmatrix} \begin{pmatrix} 0 \\ 1 \\ 1 \\ 0 \\ 1 \\ 0 \\ 0 \\ 0 \\ 1 \\ 1 \end{pmatrix} = \begin{pmatrix} 0 \\ 1 \\ 1 \\ 0 \\ 0 \end{pmatrix} \neq \underline{0} \longrightarrow \text{Perform next iteration}$$

Syndrome check

LDPC DECODER, SEMICONDUCTOR MEMORY SYSTEM AND OPERATING METHOD THEREOF

CROSS-REFERENCE TO RELATED APPLICATION

This application claims priority under 35 U.S.C. § 119 to Korean Patent Application No. 10-2019-0002635, filed on Jan. 9, 2019, which is incorporated herein by reference in its entirety.

BACKGROUND

1. Field

Various embodiments of the present invention relate to a low density parity check (LDPC) decoder, a semiconductor memory system and an operating method thereof.

2. Discussion of the Related Art

In general, semiconductor memory devices are classified into volatile memory devices, such as a dynamic random access memory (DRAM) and a static RAM (SRAM), and non-volatile memory devices, such as a read only memory (ROM), a mask ROM (MROM), a programmable ROM (PROM), an erasable PROM (EPROM), an electrically EPROM (EEPROM), a ferromagnetic RAM (FRAM), a phase change RAM (PRAM), a magnetic RAM (MRAM), a resistive RAM (RRAM or ReRAM) and a flash memory.

A volatile memory device loses data stored therein when power supply thereto is interrupted, whereas a non-volatile memory device retains data stored therein even when power supply thereto is interrupted. A non-volatile flash memory device is widely used as a storage medium in a computer system because of its high program speed, low power consumption and large data storage capacity.

In non-volatile memory devices, especially of the flash type, the number of data states of each memory cell depend on the number of bits that the memory cell can program. A memory cell storing 1-bit data per cell is called a single-bit cell or a single-level cell (SLC). A memory cell storing 2-bit data per cell is called a multi-bit cell, a multi-level cell (MLC) or a multi-state cell. A memory cell storing 3-bit data per cell is called a triple-level cell (TLC). The MLC and TLC are advantageous for high integration. However, as the number of bits programmed in each memory cell increases, the reliability decreases and the read failure rate increases.

For example, when k bits are to be programmed in a memory cell, one of $2^k$ threshold voltages is formed in the memory cell. Due to minute differences between the electrical characteristics of memory cells, the threshold voltages of memory cells programmed for the same data form threshold voltage distributions. Threshold voltage distributions correspond to $2^k$ data values corresponding to k-bit information, respectively.

However, a voltage window available for threshold voltage distributions is finite. Therefore, as the value k increases, the distance between the threshold voltage distributions decreases even to the extent that neighboring threshold voltage distributions overlap. When neighboring threshold voltage distributions overlap, read data may include error bits.

FIG. 1 is a threshold voltage distribution illustrating program and erase states of a 3-bit TLC non-volatile memory device.

FIG. 2 is a threshold voltage distribution illustrating program and erase states due to characteristic deterioration of the 3-bit TLC non-volatile memory device.

In the TLC non-volatile memory device, e.g., the TLC flash memory device capable of storing 3-bit data (i.e., k=3) in a single memory cell, the memory cell may have one of $2^3$, i.e., 8 threshold voltage distributions.

Threshold voltages of memory cells programmed for the same data form the threshold voltage distribution due to characteristic differences between memory cells. In the 3-bit TLC non-volatile memory device, as illustrated in FIG. 1, threshold voltage distributions are formed in correspondence with the data states including 7 program states 'P1' to 'P7' and an erase state 'E'.

FIG. 1 shows an ideal case in which threshold voltage distributions do not overlap and have sufficient read voltage margins therebetween.

Referring to the flash memory example of FIG. 2, the memory cell may experience charge loss as electrons trapped at a floating gate or tunnel oxide film are discharged over time. Such charge loss may accelerate when the tunnel oxide film deteriorates by iterative program and erase operations. The charge loss results in a decrease in the threshold voltages of memory cells. For example, as illustrated in FIG. 2, the threshold voltage distribution may be shifted left due to charge loss.

Further, program disturbance, erase disturbance and/or back pattern dependency also cause increases in threshold voltages. As characteristics of memory cells deteriorate, neighbouring threshold voltage distributions may overlap, as illustrated in FIG. 2.

Once neighbouring threshold voltage distributions overlap, read data may include a significant number of errors when a particular read voltage is applied to a selected word line. For example, when a sensed state of a memory cell according to a read voltage Vread3 that is applied to a selected word line is on, the memory cell is determined to have a second program state 'P2'. When a sensed state of a memory cell according to a read voltage Vread3 applied to a selected word line is off, the memory cell is determined to have a third program state 'P3'. However, when neighbouring threshold voltage distributions overlap, a memory cell that has the third program state 'P3' may be erroneously determined to have the second program state 'P2'. In short, when the neighbouring threshold voltage distributions overlap as illustrated in FIG. 2, read data may include a significant number of errors.

Therefore, a scheme for precisely reading data stored in memory cells of a semiconductor memory device is needed.

SUMMARY

Various embodiments are directed to a semiconductor memory system capable of improving the performance of an LDPC decoder in an error floor region, and an operating method thereof.

In accordance with an embodiment of the present invention, a semiconductor memory system may include: a semiconductor memory device suitable for storing a codeword including encoded data; and a low density parity check (LDPC) decoder suitable for decoding the codeword to generate decoded data by receiving the codeword from the semiconductor memory device, wherein the LDPC decoder comprises: a message passing decoding component suitable for performing a first decoding operation of decoding the codeword up to a maximum number of iterations, and calculating a minimum value among numbers of unsatisfied check nodes (UCNs), which are measured in each iteration; and an error path detection component suitable for detecting error path candidates using a tree in which each of UCNs corresponding to the minimum value is set to a root node, when the first decoding operation fails and the minimum value is less than or equal to a second threshold value, sorting the error path candidates in ascending order of maximum log likelihood ratios (LLRs), resetting symbol values and LLRs of variable nodes in the error path candidates according to the order in which the error path candidates are sorted, and providing the message passing decoding component with information on the reset symbol values and LLRs, wherein the message passing decoding component performs a second decoding operation up to a maximum number of re-decoding iterations, based on the provided information on the reset symbol values and LLRs.

In accordance with an embodiment of the present invention, an operation method of a semiconductor memory system may include: performing a first decoding operation of decoding a codeword up to a maximum number of iterations; calculating a minimum value among the numbers of unsatisfied check nodes (UCNs), which are measured in each iteration; detecting error path candidates using a tree in which each of UCNs corresponding to the minimum value is set to a root node, when the first decoding operation fails and the minimum value is less than or equal to a second threshold value; sorting the error path candidates in ascending order of maximum log likelihood ratios (LLRs); resetting the symbol values and LLRs of variable nodes in the error path candidates according to the order in which the error path candidates are sorted; and performing decoding again up to a maximum number of re-decoding iterations, based on the reset symbol values and LLRs of the variable nodes, whenever the symbol values and the LLRs are reset.

In accordance with an embodiment of the present invention, a low density parity check (LDPC) decoder may include: a decoding component suitable for decoding data; and an error path detection component suitable for determining paths between unsatisfied check nodes in a tree corresponding to the decoded data, detecting at least one error path among the determined paths based on log likelihood ratios (LLRs) for variable nodes of the determined paths; and changing an LLR value for at least one variable node in the at least one error path, wherein the decoding component decodes the data again using the changed LLR value.

DETAILED DESCRIPTION

Various embodiments are described below in more detail with reference to the accompanying drawings. The present invention may, however, be embodied in different forms and should not be construed as limited to the embodiments set forth herein. Rather, these embodiments are provided so that this disclosure is thorough and complete and fully conveys the scope of the present invention to those skilled in the art. The scope of the present invention is defined by the claims of the present invention. Also, throughout the specification, reference to "an embodiment," "another embodiment" or the like is not necessarily to only one embodiment, and different references to any such phrase are not necessarily to the same embodiment(s).

Figure 1:
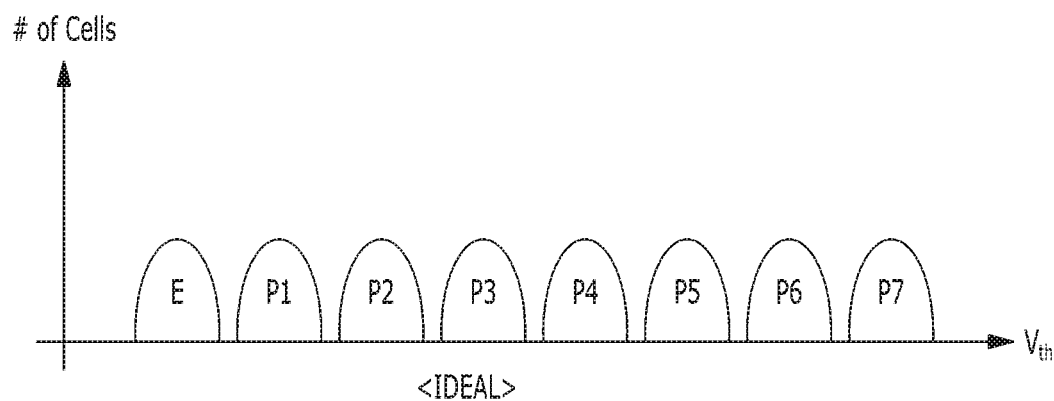
FIG. 1 is a threshold voltage distribution illustrating program and erase states of a 3-bit TLC non-volatile memory device.
Figure 2:
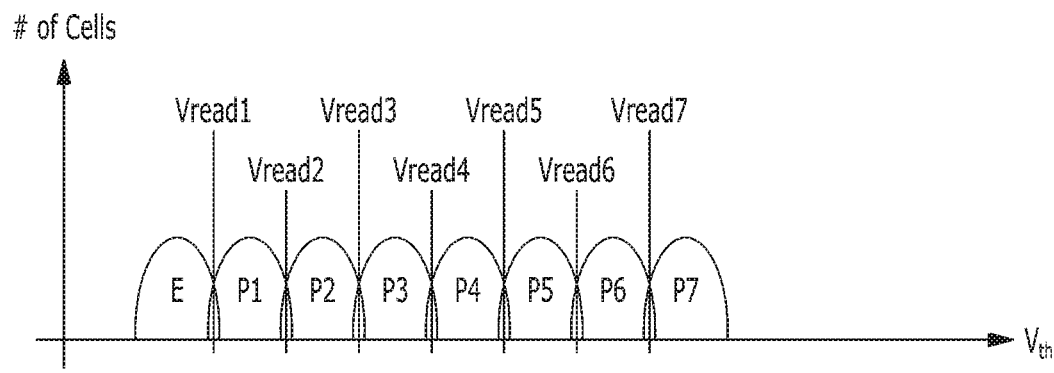
FIG. 2 is a threshold voltage distribution illustrating program and erase states due to characteristic deterioration of a 3-bit MLC non-volatile memory device.
Figure 3:
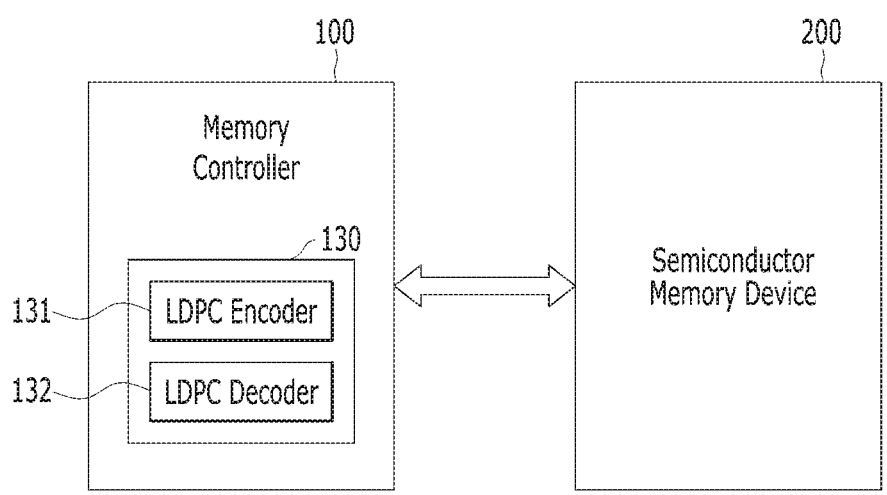
FIG. 3 is a block diagram illustrating a semiconductor memory system in accordance with an embodiment of the present invention.

FIG. 3 is a block diagram illustrating a semiconductor memory system 10 in accordance with an embodiment of the present invention.

Figure 4A:
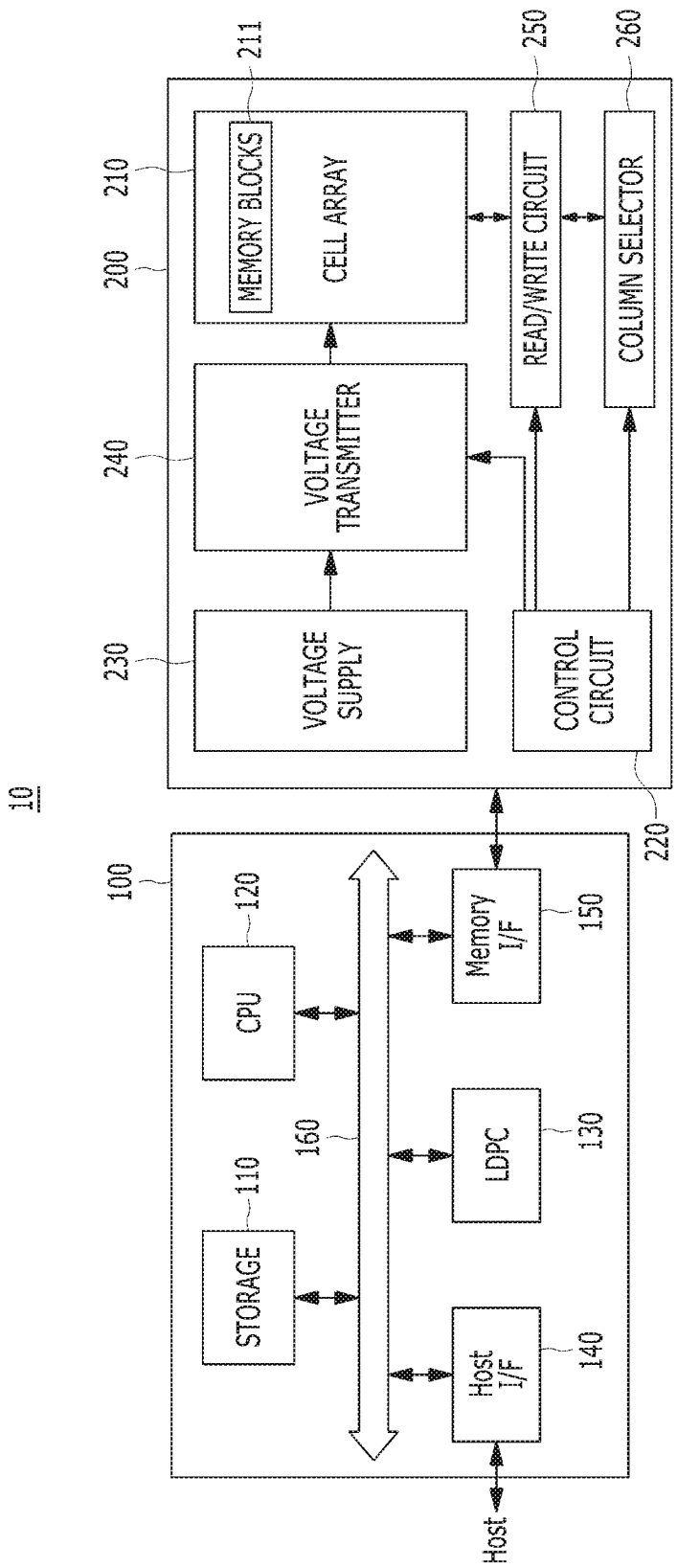
FIG. 4A is a block diagram illustrating a semiconductor memory system shown in FIG. 3.

FIG. 4A is a block diagram illustrating the semiconductor memory system 10 shown in FIG. 3.

Figure 4B:
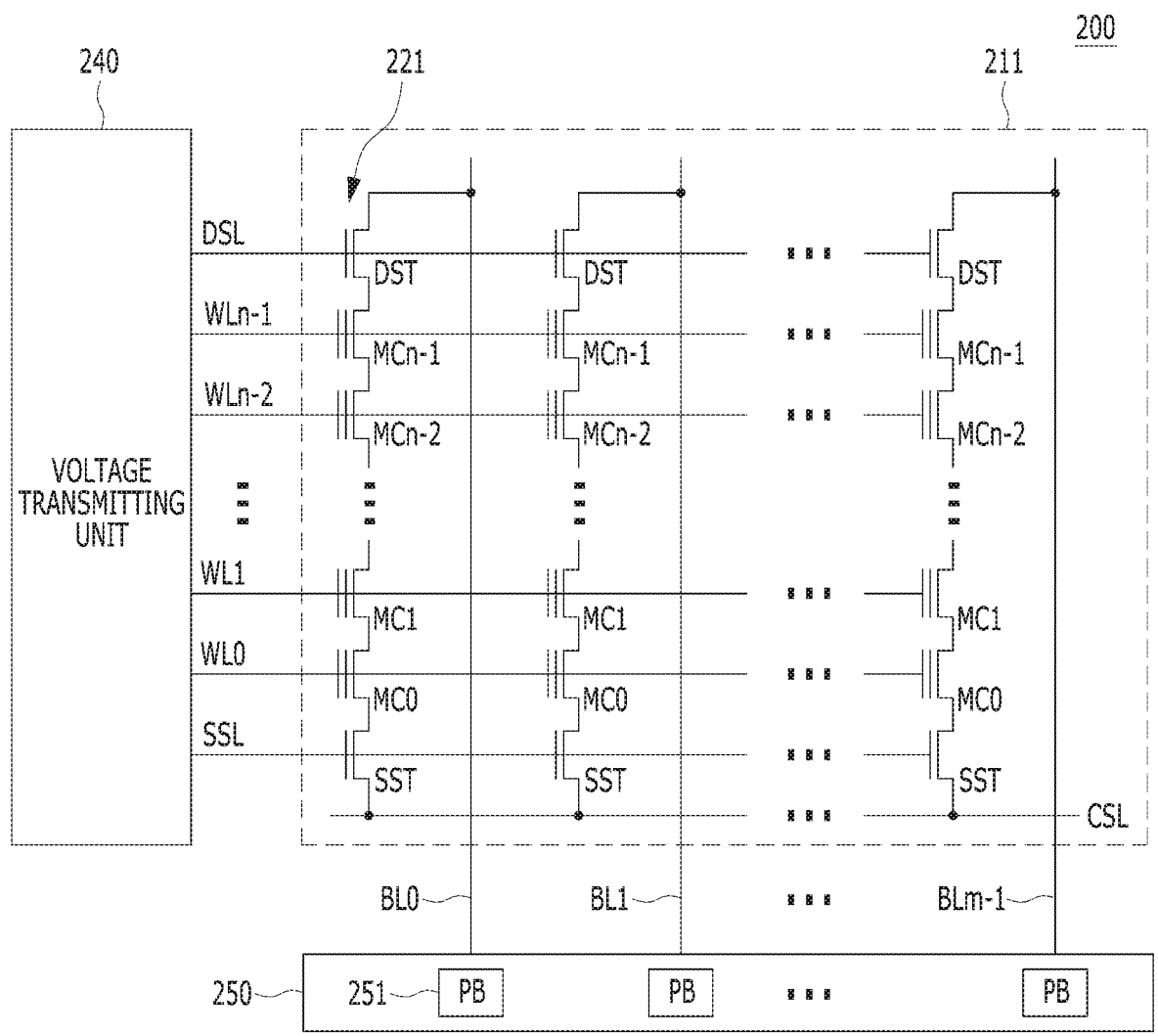
FIG. 4B is a circuit diagram illustrating a memory block, such as that shown in FIG. 4A.

FIG. 4B is a circuit diagram illustrating a memory block 211 shown in FIG. 4A.

Figure 5:
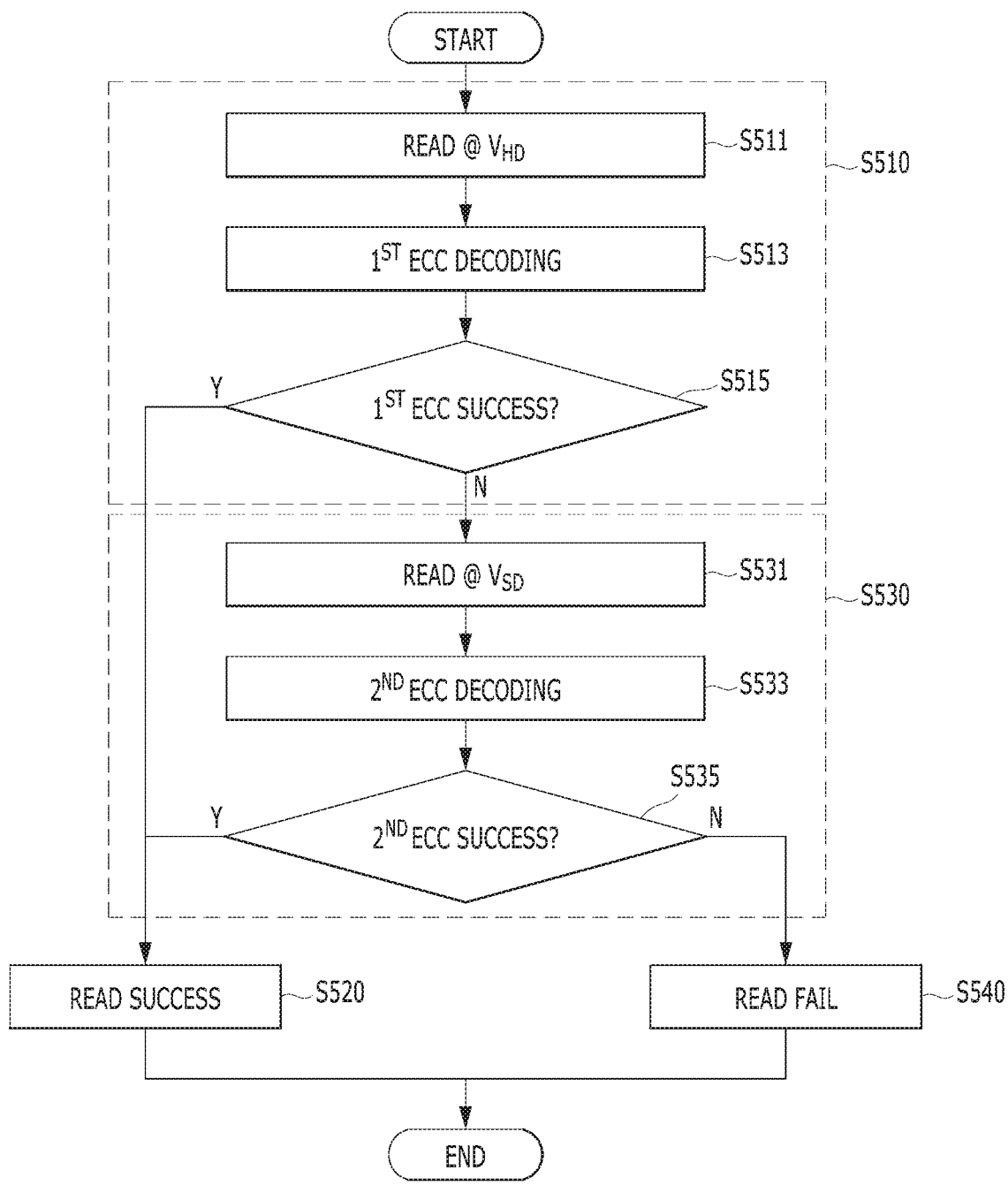
FIG. 5 is a flowchart illustrating an operation of a memory controller shown in FIG. 4A.

FIG. 5 is a flowchart illustrating an operation of a memory controller 100 included in the semiconductor memory system 10.

Referring to FIGS. 3 to 5, the semiconductor memory system 10 may include the memory controller 100 and a semiconductor memory device 200.

The semiconductor memory device 200 may perform erase, program, and read operations under the control of the memory controller 100. The semiconductor memory device 200 may receive a command CMD, an address ADDR and data DATA through input and output lines. The semiconductor memory device 200 may be provided with power PWR through a power line and receive a control signal CTRL through a control line. The control signal may include a command latch enable (CLE) signal, an address latch enable (ALE) signal, a chip enable (CE) signal, a write enable (WE) signal, and a read enable (RE) signal.

The memory controller 100 may control overall operations of the semiconductor memory device 200. The memory controller 100 may include a low-density parity check (LDPC) component 130 for correcting error bits. The LDPC component 130 may include a LDPC encoder 131 and a LDPC decoder 133.

The LDPC encoder 131 may perform error correction encoding on data to be programmed into the semiconductor memory device 200 to output data to which parity bits are added. The parity bits may be stored in the semiconductor memory device 200.

The LDPC decoder 133 may perform error correction decoding on data read from the semiconductor memory device 200. The LDPC decoder 133 may determine whether the error correction decoding is successful, and may output an instruction signal based on the determination result. The LDPC decoder 133 may correct error bits of data using the parity bits generated by the LDPC encoding operation.

When the number of error bits exceeds the error correction capacity of the LDPC component 130, the LDPC component 130 may not correct the error bits. In this case, the LDPC component 130 may generate an error correction fail signal.

The LDPC component 130 may correct an error through the LDPC code. The LDPC component 130 may include any and all circuits, systems, or devices for suitable error correction. The LDPC code may be a binary LDPC code or a non-binary LDPC code.

In accordance with an embodiment of the present invention, the LDPC component 130 may perform an error bit correcting operation using hard decision read data and soft decision read data.

The memory controller 100 and the semiconductor memory device 200 may be integrated in a single semiconductor device to form a solid-state drive (SSD). The solid state drive may include a storage device for storing data in a semiconductor memory. When the semiconductor memory system 10 is used in an SSD, operation speed of a host (not shown) coupled to the semiconductor memory system 10 may be remarkably improved.

In another embodiment, the memory controller 100 and the semiconductor memory device 200 may be integrated in a single semiconductor device to configure a memory card, such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

For another example, the semiconductor memory system 10 may be provided as one of various elements comprising an electronic device such as a computer, an ultra-mobile personal computer (PC) (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, an radio-frequency identification (RFID) device, or elements devices of a computing system.

Referring to FIG. 4A, the memory controller 100 may include a storage 110, a central processing unit (CPU) 120, the LDPC component 130, a host interface (I/F) 140, a memory interface 150 and a system bus 160. The storage 110 may operate as a working memory of the CPU 120.

The host interface 140 may communicate with a host through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The LDPC component 130 may detect and correct errors included in the data read from the semiconductor memory device 200. The memory interface 150 may interface with the semiconductor memory device 200. The LDPC encoder 131 and the LDPC decoder 133 may be implemented as separate and independent components even though FIG. 4A exemplarily shows the LDPC component 130 including both of the LDPC encoder 131 and the LDPC decoder 133. The CPU 120 may perform various control operations.

In accordance with an embodiment of the present invention, during the program operation, the LDPC component 130 may perform a LDPC encoding to an original data which is to be programmed to the semiconductor memory device 200. In such case, during the read operation, the LDPC component 130 may perform a LDPC decoding to the LDPC-encoded data or a codeword, which is stored in the semiconductor memory device 200.

The LDPC component 130 may restore the original data, which is the state of the data before the LDPC encoding operation was performed on it during the program operation, by performing the LDPC decoding operation to the LDPC-encoded data or the codeword stored in the semiconductor memory device 200.

As discussed with reference to FIG. 5, the read operation to the data stored in the semiconductor memory device 200 may include a hard decision read operation of step S511 and a soft decision read operation of step S531. During the hard decision read operation, data may be read from the semiconductor memory device 200 according to a hard decision read voltage $V_{HD}$. During the soft decision read operation, data may be read from the semiconductor memory device 200 according to soft decision read voltages $V_{SD}$, which are different than the hard decision read voltage $V_{HD}$. For example, an additional read operation according to the soft decision read voltages $V_{SD}$ may be performed to the memory cell, which is first read according to the hard decision read voltage $V_{HD}$.

The LDPC-encoded data or the codeword, which is stored in the semiconductor memory device 200 and is read through the hard decision read operation, may be decoded back to the original data by the LDPC component 130.

The soft decision read operation generates a log-likelihood ratio (LLR), which provides an indication of the reliability of the hard decision read data read through the hard decision read operation, according to the soft decision read voltages $V_{SD}$.

The LDPC component 130 may perform the LDPC decoding operation to the LLR. The LDPC component 130 may detect and correct the error of the LDPC-encoded data or the codeword read from the semiconductor memory device 200 through the LLR.

The semiconductor memory device 200 may include a memory cell array 210, a control circuit 220, a voltage supply 230, a voltage transmitter 240, a read and write (read/write) circuit 250, and a column selector 260.

The memory cell array 210 may include a plurality of memory blocks 211. User data may be stored in the memory block 211.

Referring to FIG. 4B, the memory block 211 may include a plurality of cell strings 221 coupled to bit lines BL0 to BLm-1, respectively. Each of the cell strings 221 of each column may include one or more drain selection transistors DST and one or more source selection transistors SST. A plurality of memory cells or memory cell transistors may be serially coupled between the selection transistors DST and SST. Each of the memory cells MC0 to MCn-1 may be formed of a multi-level cell (MLC) storing data (or information) of multiple bits in each cell. The cell strings 221 may be electrically coupled to the corresponding bit lines BL0 to BLm-1, respectively.

FIG. 4B exemplarily illustrates a memory block 211 comprising a NAND-type flash memory cell. However, the semiconductor memory device 200 is not limited to being NAND flash memory, but may comprise NOR-type flash memory, hybrid flash memory in which two or more types of memory cells are combined, and one-NAND flash memory in which a controller is embedded inside a memory chip. Operation characteristics of the semiconductor device may be applied to a charge trap flash (CTF) in which a charge storing layer is formed by an insulating layer, as well as the flash memory device in which a charge storing layer is formed by a conductive floating gate.

Referring back to FIG. 4A, the control circuit 220 may control overall operations related to program, erase, and read operations of the semiconductor memory device 200.

The voltage supply 230 may provide word line voltages, for example, a program voltage, a read voltage, and a pass voltage, to the respective word lines according to an operation mode. Further, the voltage supply 230 may provide a voltage to be supplied to a bulk, for example, a well region in which the memory cells are formed. A voltage generating operation of the voltage supply 230 may be performed under control of the control circuit 220.

The voltage supply 230 may generate a plurality of variable read voltages for generating a plurality of read data.

The voltage transmitter 240 may select one of the memory blocks 211 or sectors of the memory cell array 210, and may select one of the word lines of the selected memory block under the control of the control circuit 220. The voltage transmitter 240 may provide the word line voltage generated from the voltage supply 230 to selected word lines or non-selected word lines under the control of the control circuit 220.

The read/write circuit 250 may be controlled by the control circuit 220 and may operate as a sense amplifier or a write driver according to an operation mode. For example, during a verification/normal read operation, the read/write circuit 250 may operate as a sense amplifier for reading data from the memory cell array 210. During the normal read operation, the column selector 260 may output the data read from the read/write circuit 250 to the outside, for example, to the memory controller 100, based on column address information. On the other hand, during the verification read operation, the read data may be provided to a pass/fail verification circuit (not illustrated) included in the semiconductor memory device 200, and be used for determining whether a program operation of the memory cell succeeds.

During the program operation, the read/write circuit 250 may operate as a write driver for driving the bit lines according to data to be stored in the memory cell array 210. During the program operation, the read/write circuit 250 may receive the data to be written in the memory cell array 210 from a buffer (not illustrated), and may drive the bit lines according to the input data. To this end, the read/write circuit 250 may include a plurality of page buffers (PB) 251 corresponding to the columns (or the bit lines) or column pairs (or bit line pairs), respectively. A plurality of latches may be included in each of the page buffers 251.

Referring to FIGS. 4A and 5, the operation of the memory controller 100 may include a hard decision decoding step S510, and may additionally include a soft decision decoding step S530. A target data to which the hard and soft decision decoding steps S510 and S530 are applied may be the LDPC-encoded data or the codeword, which is LDPC-encoded by the LDPC component 130.

The hard decision decoding step S510 may include applying hard decision LDPC decoding to data of a set or predetermined length, which is read from a memory cell of the memory block 211 according to the hard decision read voltage $V_{HD}$. The hard decision decoding step S510 may include steps S511 to S515.

The soft decision decoding step S530 may include applying LDPC decoding to form soft decision read data according to soft decision read voltages $V_{SD}$ around the hard decision read voltage $V_{HD}$ when the hard decision LDPC decoding of step S510 finally fails. The soft decision decoding step S530 may include steps S531 to S535.

As described above, at the hard decision read step S511, data may be read from the semiconductor memory device 200 according to the hard decision read voltage $V_{HD}$. The memory controller 100 may provide a read command and an address to the semiconductor memory device 200. The semiconductor memory device 200 may read the data therefrom according to the hard decision read voltage $V_{HD}$ in response to the read command and the address. The read data may be provided to the memory controller 100.

At step S513, the hard decision decoding, e.g., hard decision LDPC decoding, may be performed. The LDPC component 130 may perform the hard decision LDPC decoding on the data read from the semiconductor memory device 200 according to the hard decision read voltage $V_{HD}$ by using the error correction code.

At step S515, it may be determined whether the hard decision LDPC decoding (or first ECC decoding) succeeded or failed. That is, at step S515, it may be determined whether an error of the read data, on which the hard decision LDPC decoding is performed at step S513, is corrected. For example, the memory controller 100 may determine whether an error of the read data is corrected by using the hard decision read data and a parity check matrix. For example, when product result of the parity check matrix and the hard decision read data is a zero vector ('0'), it may be determined that the hard decision read data is corrected. On the other hand, when product result of the parity check matrix and the hard decision read data is not the zero vector ('0'), it may be determined that the hard decision read data is not corrected.

When it is determined that the hard decision read data is corrected as a result of the determination of step S515, that may indicate that the read operation according to hard decision read voltage $V_{HD}$ at step S511 was successful (step S520) and the operation of the memory controller 100 may end. The hard decision read data, as a result of the hard decision LDPC decoding performed at step S513, may be now the error-corrected data and may be provided externally or used in the memory controller 100.

When it is determined that the hard decision read data is not corrected as a result of the determination of step S515, the soft decision decoding step S530 may be performed.

As described above, at the soft decision read step S531, data may be read from the semiconductor memory device 200 according to the soft decision read voltages $V_{SD}$. For example, the additional read operations according to the soft decision read voltages $V_{SD}$ may be performed on the memory cell, to which the hard decision decoding step S510 is performed according to the hard decision read voltage $V_{HD}$. The soft decision read voltages $V_{SD}$ may be different than the hard decision read voltage $V_{HD}$.

At step S533, the soft decision decoding, e.g., soft decision LDPC decoding, may be performed. The soft decision LDPC decoding may be performed based on the result of the hard decision LDPC decoding, and data read from the memory cell according to the soft decision read voltages $V_{SD}$. The hard decision read voltage $V_{HD}$ and the soft decision read voltages $V_{SD}$ may be different.

For example, each of the memory cells MC0 to MCn-1 of the semiconductor memory device 200 may belong to one of the threshold voltage distributions including 7 program states P1 to P7 and 1 erase state E.

The hard decision read voltage $V_{HD}$ may be between 2 neighbouring states of the plurality of states (E and P1 to P7). Each of the soft decision read voltages $V_{SD}$ may be between 2 neighbouring states of the plurality of states (E and P1 to P7), which is different from the hard decision read voltage $V_{HD}$.

The read data read from the memory cells MC0 to MCn-1 according to the hard decision read voltage $V_{HD}$ and according to the soft decision read voltages $V_{SD}$ may have different values. For example, there may be at least one tailed memory cell among the memory cells MC0 to MCn-1 having the threshold voltage higher or lower than the threshold voltage distribution of the normal logic state. The data read from the tailed memory cell according to the hard decision read voltage $V_{HD}$ and according to the soft decision read voltages $V_{SD}$ may have different values. When the additional read operation according to the soft decision read voltages $V_{SD}$ is performed in addition to the read operation according to the hard decision read voltage $V_{HD}$, additional information on the threshold voltages of the memory cells MC0 to MCn-1 (i.e., additional information on the tailed memory cells) or the log likelihood ratio (LLR) providing reliability of the hard decision read data read by the hard decision read operation may be obtained.

When the additional information is obtained, the probability of whether the data of the memory cells MC0 to MCn-1 belong to the first state (i.e., '1'), or the second state (i.e., '0'), may increase. That is, the reliability of the LDPC decoding may increase. The memory controller 100 may perform the soft decision LDPC decoding based on the soft decision read data, which is read according to the hard decision read voltage $V_{HD}$ and the soft decision read voltages $V_{SD}$. The relationship between the hard decision read voltage $V_{HD}$ and the soft decision read voltages $V_{SD}$ will be disclosed with reference to FIGS. 7A and 7B.

At step S535, it may be determined whether the soft decision LDPC decoding (or second ECC decoding) succeeded or failed. That is, at step S535, it may be determined whether an error of the soft decision read data, as a result of the soft decision LDPC decoding performed at step S533, is corrected. For example, the memory controller 100 may determine whether an error of the soft decision read data is corrected by using the soft decision read data and the parity check matrix. For example, when product result of the parity check matrix and the soft decision read data is the zero vector ('0'), it may be determined that the soft decision read data is corrected. On the other hand, when product result of the parity check matrix and the soft decision read data is not the zero vector ('0'), it may be determined that the soft decision read data is not corrected.

The product process of the parity check matrix and the hard decision read data during the hard decision decoding step S510 may be the same as the product process of the parity check matrix and the soft decision read data during the soft decision decoding step S530.

When it is determined that the soft decision read data is corrected as the result of determination of step S535, it may be determined at step S520 that the read operation according to soft decision read voltage $V_{SD}$ at step S531 was successful and the operation of the memory controller 100 may end. The soft decision read data, as a result of the soft decision LDPC decoding is performed at step S533, may be now the error-corrected data and may be provided externally or used in the memory controller 100.

When it is determined that the soft decision read data is not corrected as the result of determination of step S535, it may be determined at step S540 that the read operation of the memory controller 100 to the memory cells MC0 to MCn-1 finally failed and the operation of the memory controller 100 may end.

Figure 6A:
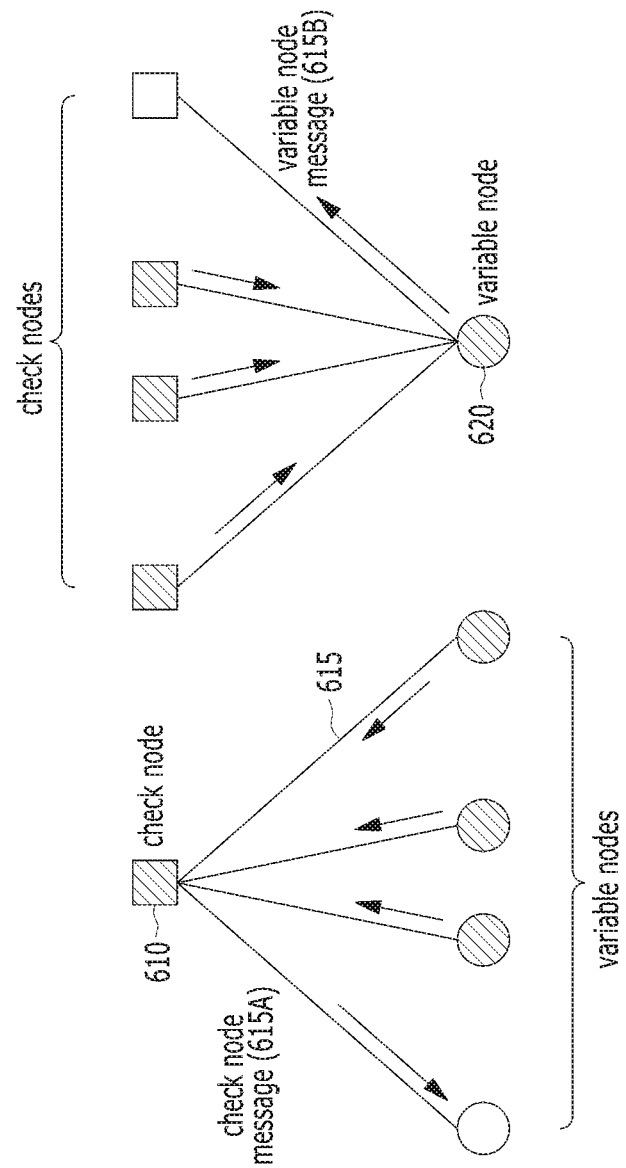
FIG. 6A is a schematic diagram illustrating low-density parity-check (LDPC) decoding represented by a Tanner graph.

FIG. 6A is a schematic diagram illustrating a low-density parity-check (LDPC) decoding represented by a Tanner graph.

Figures 6B, 6C:
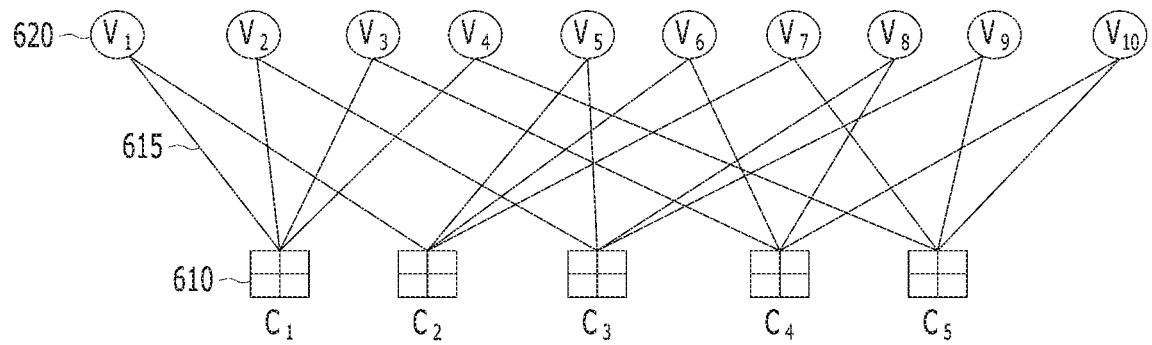
FIG. 6B is a schematic diagram illustrating an LDPC code.
FIG. 6C is a schematic diagram illustrating a syndrome check process according to LDPC decoding.

FIG. 6B is a schematic diagram illustrating an LDPC code.

FIG. 6C is a schematic diagram illustrating a syndrome check process according to the LDPC decoding.

An error correction code (ECC) is commonly used in storage systems. Various physical phenomena occurring in storage devices result in noise effects that corrupt the stored information. Error correction coding schemes can be used for protecting the stored information against the resulting errors. This is done by encoding information and then storing the encoded information in a memory device. The encoding process transforms the information into a codeword by adding redundancy to the information. This redundancy can then be used to recover the information from the possibly corrupted codeword through a decoding process.

In iterative coding schemes, the code is constructed as a concatenation of several simple constituent codes and is decoded based on an iterative decoding algorithm by exchanging information between decoders receiving the simple constituent codes. Usually, the code can be defined using a bipartite graph or a Tanner graph describing interconnections between the constituent codes. In this case, decoding can be viewed as iterative message passing over the graph edges.

The iterative codes may include the low-density parity-check (LDPC) code. The LDPC code is a linear binary block code defined by a sparse parity-check matrix H.

Referring to FIG. 6A, the LDPC code has a parity check matrix in which the number of 1 s in each row and column is very small. The structure of the LDPC code may be defined by the Tanner graph including check nodes 610, variable nodes 620, and edges 615 connecting the check nodes 610 to the variable nodes 620. A value delivered from one of the check nodes 610 to one of the variable nodes 620 after check node processing becomes a check node message 615A. A value delivered from one of the variable nodes 620 to one of the check nodes 610 after variable node processing becomes a variable node message 615B.

A decoding process of the LDPC code is performed by iterative decoding based on a 'sum-product' algorithm. A decoding method may be provided based on a suboptimal message-passing algorithm such as a 'min-sum' algorithm, which is a simplified version of the sum-product algorithm.

Referring to FIG. 6B, the Tanner graph of the LDPC code includes 5 check nodes (C1 to C5) 610 representing parity check equations of the LDPC code, 10 variable nodes (V1 to V10) 620 representing code symbols, and edges 615 representing relationships between the check nodes 610 and the variable nodes 620. The edges 615 connect each of the check nodes 610 to each of the variable nodes 620 corresponding to a code symbol included in the parity check equations represented by the check nodes 610. FIG. 6B exemplarily illustrates a regular LDPC code in which the number of variable nodes 620 coupled to each of the check nodes 610 is fixed at 4 and the number of the check nodes 200 coupled to each of the variable nodes 620 is fixed at 2. An initial value of each of the variable nodes 620 may be the hard decision read data or the soft decision read data.

FIG. 6C shows a parity check matrix H corresponding to the Tanner graph. The parity check matrix H is similar to the graphic expression of the parity check equations. The parity check matrix H has the same number of 1 s in each column and each row. That is, each column of the parity check matrix H has two is corresponding to the connections between each of the variable nodes 620 and the check nodes 610, and each row has four is corresponding to the connections between each of the check nodes 610 and the variable nodes 620.

A process of decoding the LDPC code is performed by an iterative process of exchanging messages, which are generated and updated in each node, between the variable nodes 620 and the check nodes 610 in the Tanner graph. In this case, each node updates the messages based on the sum-product algorithm or a similar suboptimal algorithm.

For example, the LDPC decoding may comprise a plurality of iterations, each of which includes update of the check nodes, update of the variable nodes, and a syndrome check after an initial update of the variable nodes. After the single iteration, when the result of the syndrome check satisfies a specific condition, the LDPC decoding may end. When the result of the syndrome check does not satisfy the specific condition, an additional single iteration may be performed. The additional iteration may include a check node update, a variable node update and the syndrome check. The number of iterations may be limited to a maximum number (maximum iteration count). When the result of the syndrome check does not satisfy the specific condition when the number of iterations reaches the maximum iteration count, the LDPC decoding on the codeword may be determined to have failed in LDPC decoding.

Referring to FIG. 6C, the syndrome check is a process of identifying whether the product result "$Hv^t$" of the parity check matrix H and a vector "v", which is obtained by the update of the variable nodes, satisfies the specific condition. When the product result "$Hv^t$" becomes the zero vector, the product result "$Hv^t$" may be deemed to satisfy the specific condition.

FIG. 6C shows the syndrome check process. FIG. 6C exemplarily shows a non-zero vector "01000" as the product result "$Hv^t$", and thus FIG. 6C shows that the syndrome check does not satisfy the specific condition and another single iteration should be performed.

Considering the non-zero vector "01000" as the product result "$Hv^t$", the number of non-zero vector elements or elements that do not meet the zero vector condition, is 1. In the description, each element that does not meet the zero vector condition of the syndrome check for the product result "$Hv^t$" in a given iteration is defined as unsatisfied syndrome check (USC). FIG. 6C shows the result of the syndrome check where the number of the USC is 1.

Figure 7A:
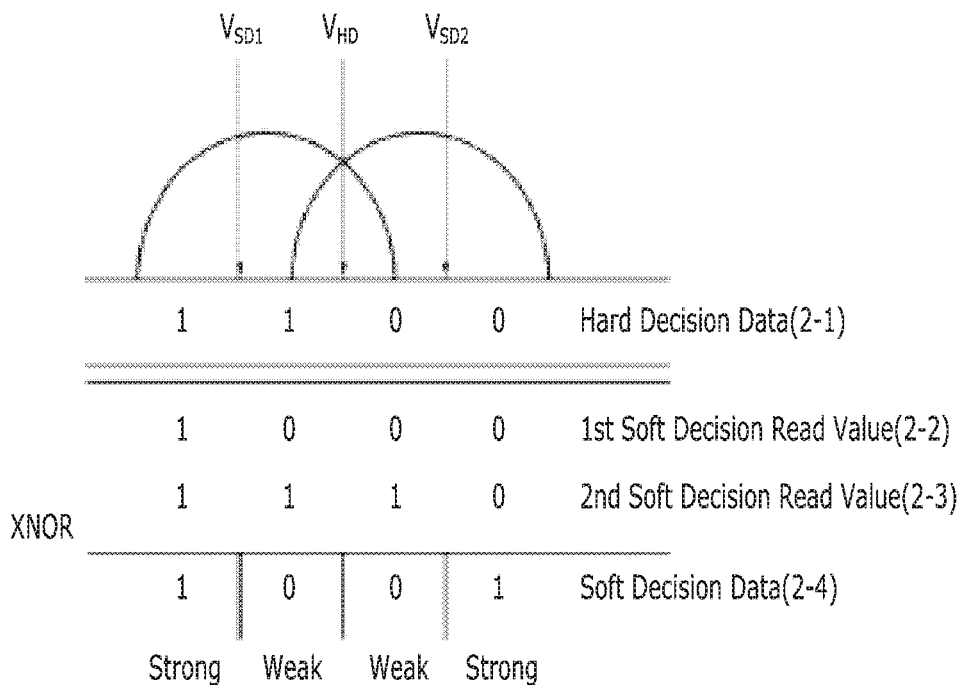
FIG. 7A is a schematic diagram illustrating a 2-bit soft decision read operation as a soft decision read operation shown in FIG. 5.
Figure 7B:
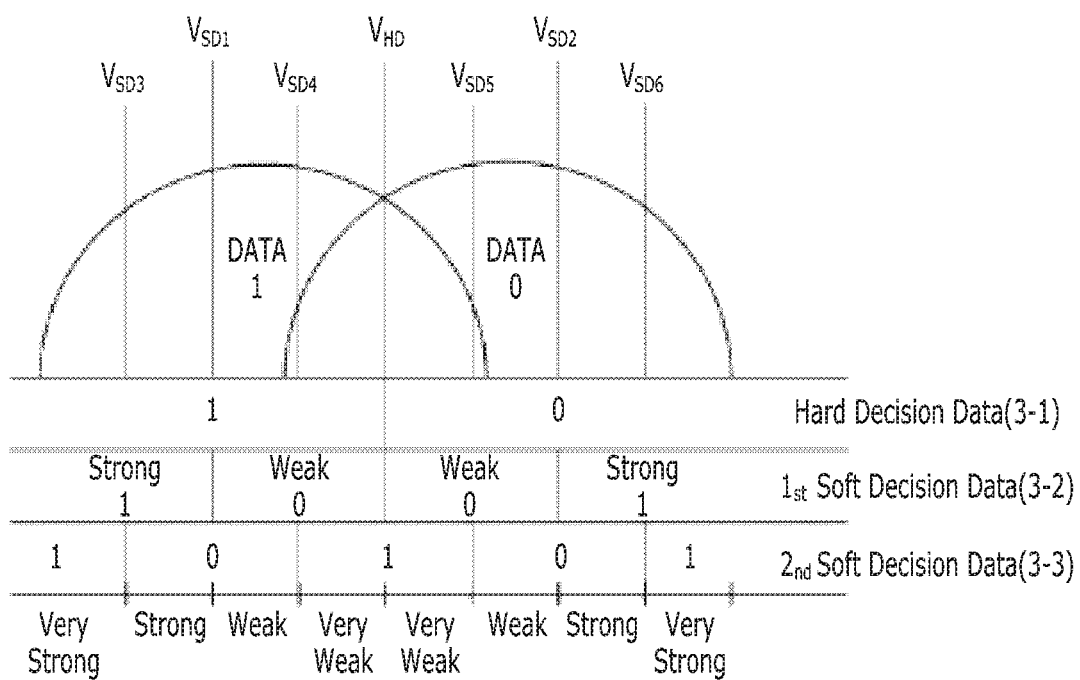
FIG. 7B is a schematic diagram illustrating a 3-bit soft decision read operation as a soft decision read operation shown in FIG. 5.

FIGS. 7A and 7B are schematic diagrams illustrating the soft decision read operation shown in FIG. 5, particularly 2-bit and 3-bit soft decision read operations, respectively.

Referring to FIG. 7A, during the hard decision decoding operation step S510 described with reference to FIG. 5, the hard decision read data 2-1 may have one of values '1' and '0' according to an on/off status of a memory cell when the hard decision read voltage $V_{HD}$ is applied to the semiconductor memory device 200 of FIG. 4A.

During the soft decision decoding operation of step S530, the log-likelihood ratio (LLR) may be generated through the soft decision read operation where the soft decision read voltages $V_{SD1}$ and $V_{SD2}$, which have different voltages from the hard decision read voltage $V_{HD}$, are applied to the memory cell.

During the 2-bit soft decision read operation, a first soft decision read value 2-2 may be '1000' according to the on/off status of a memory cell when the first soft decision read voltage $V_{SD1}$ is applied to the memory cell. In a similar way, a second soft decision read value 2-3 may be '1110' according to the on/off status of the memory cell when the second soft decision read voltages $V_{SD2}$ is applied to the memory cell.

For example, the LDPC component 130 may generate a soft decision read data 2-4 or the LLR through a logic operation (e.g., XNOR operation) to the first and second soft decision read values 2-2 and 2-3. The LLR may indicate reliability of the hard decision read data 2-1.

For example, the soft decision read data 2-4 having the value '1' may indicate a "strong" probability that the hard decision read data 2-1 has the first or second statuses (the logic values of '1' or '0'). On the other hand, the soft decision read data 2-4 having the value '0' may indicate a "weak" probability that the hard decision read data 2-1 has the first or second statuses.

Referring to FIG. 7B, during the hard decision decoding operation step S510 described with reference to FIG. 5, the hard decision read data 3-1 may have a value of '1' or '0' according to the on/off status of the memory cell when the hard decision read voltage $V_{HD}$ is applied to the semiconductor memory device 200 of FIG. 4A.

During the soft decision decoding operation step S530, the LLR may be generated through the soft decision read operation where the soft decision read voltages $V_{SD1}$ to $V_{SD6}$, which may be different than the hard decision read voltage $V_{HD}$, are applied to the memory cell.

During the 3-bit soft decision read operation, first and second soft decision read values may be generated according to the on/off status of a memory cell when first and second soft decision read voltages $V_{SD1}$ and $V_{SD2}$ are applied to the memory cell, which is similar to the 2-bit soft decision read operation described with reference to FIG. 7A. The LDPC component 130 may generate a first soft decision read data 3-2 (e.g., '1001') (or the LLR) through a logic operation (e.g., the XNOR operation) to the first and second soft decision read values.

In a similar way, during the 3-bit soft decision read operation, third to sixth soft decision read values may be generated according to the on/off status of the memory cell when third to sixth soft decision read voltages $V_{SD3}$ to $V_{SD6}$, which are different than the first and second soft decision read voltages $V_{SD1}$ and $V_{SD2}$, are applied to the memory cell, which is similar to the 2-bit soft decision read operation described with reference to FIG. 7A. The LDPC component 130 may generate a second soft decision read data 3-3 ('10101') or the LLR through the XNOR operation to the third to sixth soft decision read values. The second soft decision read data 3-3 ('10101') may provide a weighted value to the first soft decision read data 3-2.

For example, when the first soft decision data 3-2 ("strong" probability), the value '1' of the corresponding bit of the second soft decision read data 3-3 may weight that probability to be "very strong". On the other hand, the value '0' of the corresponding bit of the second soft decision read data 3-3 may indicate no weighting, that is, the probability remains "strong".

In a similar way, when the first decision data 3-2 is '0' ("weak" probability), the value of '1' of the corresponding bit of the second soft decision read data 3-3 may weight that probability to be "very weak". On the other hand, the value '0' of the corresponding bit of the second soft decision read data 3-3 may indicate no weighting, that is, the probability remains "weak". Thus, the second soft decision read data 3-3 may provide a better reliability to the hard decision read data 3-1, which is similar to the 2-bit soft decision read operation described with reference to FIG. 7A.

In general, an LDPC decoder uses a message passing (MP) algorithm such as a sum-product algorithm (SPA) or a min-sum algorithm (MSA), which performs LDPC decoding by exchanging messages between a variable node and a check node. When the LDPC decoder performs LDPC decoding according to the MP algorithm, a trapping set may occur. The trapping set indicates a set of variable nodes that cause an error which cannot be solved even though decoding is repeatedly performed. The trapping set may rapidly reduce the performance of a word error rate (WER) in a high signal-to-noise ratio (SNR) region. An error floor region may indicate a region where the performance of the WER is rapidly reduced in the high SNR region, and will be described in detail with reference to FIG. 8.

Figure 8:
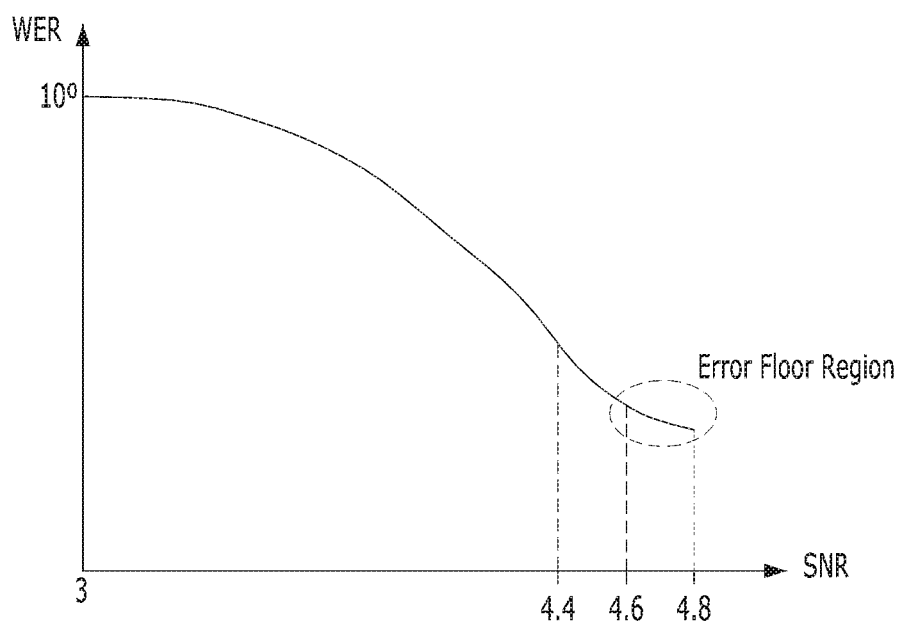
FIG. 8 is a graph for describing an error floor region.

FIG. 8 is a graph illustrating the error floor region.

The two-dimensional graph illustrated in FIG. 8 indicates a word error rate (WER) versus a signal-to-noise ratio (SNR). The x-axis of the two-dimensional graph may indicate the SNR, and the y-axis of the two-dimensional graph may indicate the WER. Since the SNR is proportional to power of an output signal and inversely proportional to noise, the SNR may have a high value when there is almost no noise and the output signal has high power. The graph shows that noise decreases as the SNR increases, and the WER continuously decreases as the power of the output signal increases. For example, the WER may rapidly decrease in the region where the SNR ranges from 3 to 4.4, and slowly decrease in the region where the SNR is greater than 4.4. In the region where the SNR ranges from 4.6 to 4.8, the decrease of the WER may converge to almost 0. The error floor region may indicate the region where the WER slightly decreases in a high SNR region such as the region where the SNR ranges from 4.6 to 4.8.

The conventional LDPC decoder may use a backtracking algorithm to improve decoding performance in the error floor region. When an error is caused by the trapping set, the LDPC decoder may select an arbitrary variable node among variable nodes connected to an unsatisfied check node UCN, and assume that the selected variable node is a variable node that caused an error (an error variable node). The LDPC decoder may reset a soft decision value of the selected error variable node, and then perform LPDC decoding again according to the MP algorithm. The LDPC decoder based on the backtracking algorithm may exhibit a performance improvement in the error floor region. However, when the selected variable node is not an error variable node belonging to the trapping set, many decoding operations may be additionally required, thereby causing a great loss in terms of complexity and latency.

The LDPC decoder 133 in accordance with an embodiment may perform LDPC decoding according to a path search algorithm that uses the structural characteristic of the trapping set and the statistical characteristic of soft decision values. As will be described below, the LDPC decoder 133 may distinguish between an error path and non-error paths, reset soft decision values of error variable nodes included in the error path, and perform decoding according to the MP algorithm, thereby rapidly and correctly removing an error caused by the trapping set.

Figure 9:
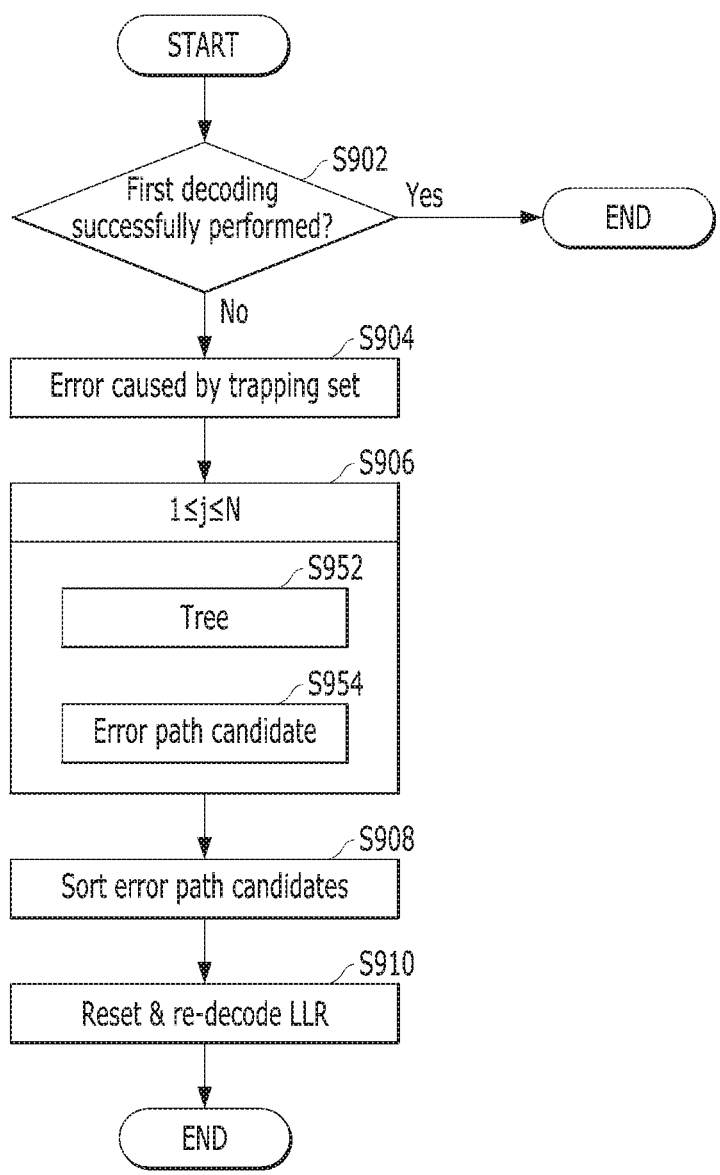
FIG. 9 is a flowchart illustrating an operation process of an LDPC decoder in accordance with an embodiment.

FIG. 9 is a flowchart illustrating an operation process of the LDPC decoder 133 in accordance with an embodiment.

Referring to FIG. 9, in step S902, the LDPC decoder 133 may perform first decoding according to the MP algorithm, based on symbol values and LLR vectors for variable nodes provided from a channel. The LDPC decoder 133 may set the maximum quantized value to a first threshold value η. The maximum quantized value indicates the maximum value of LLR vector magnitudes |LLR| which the respective variable nodes may have. The LDPC decoder 133 may repeatedly perform a cycle composed of a variable node update operation, a check node update operation and a syndrome check operation over the maximum iteration count $I_{max}$. When a codeword is successfully decoded within the maximum iteration count $I_{max}$ ('Yes' in step S902), the LDPC decoder 133 may end the first decoding, and output a result value obtained by decoding the codeword. The LDPC decoder 133 may measure the number of UCNs whenever the cycle is repeated, and separately store the measured number of UCNs. As will be described below, the LDPC decoder 133 may check whether there is an error caused by a trapping set, based on the measured number of UCNs. When the codeword is not successfully decoded within the maximum iteration count $I_{max}$ ('No' in step S902), the LDPC decoder 133 may end the first decoding, and check whether there is an error caused by the trapping set.

In step S904, the LDPC decoder 133 may check whether there is an error caused by the trapping set. In accordance with an embodiment, the LDPC decoder 133 may determine that there is an error caused by the trapping set, when the minimum value of the numbers of UCNs, which are separately stored whenever the cycle is performed, is less than or equal to a second threshold value $\tau_u$ in step S902. When the LDPC decoding does not succeed even though the number of UCNs is sufficiently low, the LDPC decoder 133 may determine that there is a set of variable nodes that cause an error which cannot be solved even though decoding is repeatedly performed, i.e. a trapping set. The minimum value is denoted 'N'. In this case, the LDPC decoder 133 may define UCNs for the minimum value as a UCN set $\mathcal{C}_T$, and separately store information on first to $N^{th}$ UCNs included in the UCN set $\mathcal{C}_T$. As will be described below, the LDPC decoder 133 may detect an error path from a plurality of paths that connect two different UCNs among the UCNs in the UCN set $\mathcal{C}_T$.

In step S906, the LDPC decoder 133 may perform a path search operation to detect an error path candidate. The error path may indicate a path including only error variable nodes, among paths connected from the first UCN to the second UCN, when there is an error caused by the trapping set. The first UCN and the second UCN may be different UCNs. The LDPC decoder 133 may define the number of error variable nodes present in the error path as the length of the error path.

Figure 10:
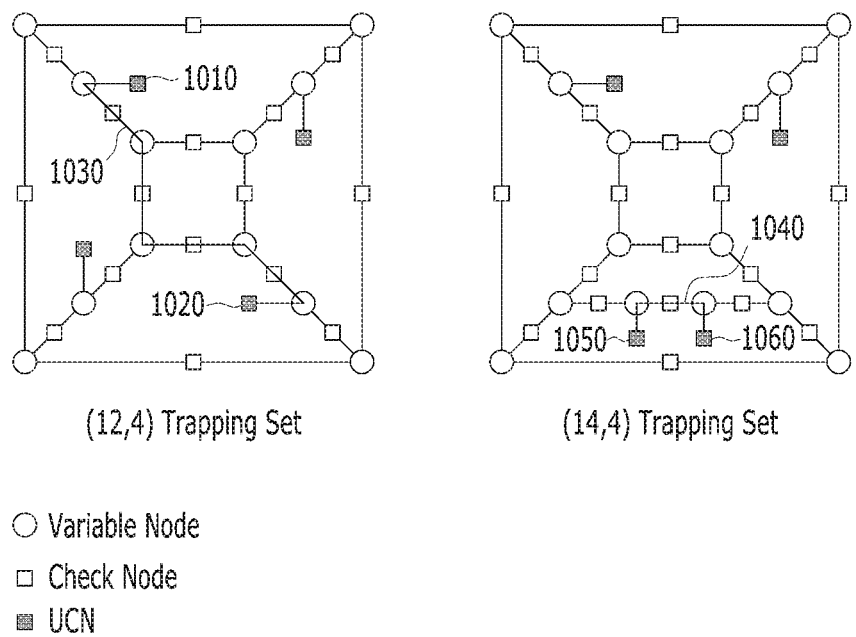
FIG. 10 is a diagram illustrating an error path in accordance with an embodiment.

FIG. 10 is a diagram illustrating an error path in accordance with an embodiment.

By way of example, FIG. 10 illustrates (12, 4) and (14, 4) trapping sets which are main trapping sets of Margulis LDPC codes.

The (12, 4) trapping set may indicate a trapping set in which 12 variable nodes and four UCNs are present. As described above, the variable nodes in the (12, 4) trapping set may be all error variable nodes, and the error path may indicate a path including only error variable nodes among the paths connecting the first UCN to the second UCN. For example, the (12, 4) trapping set may include a plurality of paths connecting a first UCN 1010 to a second UCN 1020. Among the plurality of paths, a first path 1030 may indicate an error path having a length of 5. Since the first path 1030 connects the first UCN 1010 to the second UCN 1020 and the variable nodes in the first path 1030 are all error variable nodes, the first path 1030 may be an error path. Furthermore, since five error variable nodes are included in the first path 1030, the first path 1030 may have a length of 5.

The (14, 4) trapping set may indicate a trapping set in which 14 variable nodes and four UCNs are present. Therefore, the variable nodes in the (14, 4) trapping set may be all error variable nodes. In a similar manner as described for the first path 1030, it is possible to determine whether a second path 1040 is an error path. Since the second path 1040 connects a third UCN 1050 to a fourth UCN 1060 and variable nodes in the second path 1040 are all error variable nodes, the second path 1040 may be an error path. Furthermore, since two error variable nodes are included in the second path 1040, the second path 1040 may have a length of 2.

As checked through the (12, 4) trapping set and the (14, 4) trapping set, an error path may indicate a path including only error variable nodes among a plurality of paths connecting different UCNs. In accordance with an embodiment, the LDPC decoder 133 may detect an error path candidate based on the LLR vector magnitudes |LLR| of the variable nodes in each of the plurality of paths connecting different UCNs.

Referring back to FIG. 9, the LDPC decoder 133 may detect an error path candidate by repeatedly performing steps S952 and S954 on the first to $N^{th}$ UCNs in the UCN set $\mathcal{C}_T$ configured in step S904, in step S906.

In step S952, the LDPC decoder 133 may configure trees in which the UCNs in the UCN set $\mathcal{C}_T$ are respectively set to root nodes. For example, the LDPC decoder 133 may position the first UCN in the UCN set $\mathcal{C}_T$ at a first level corresponding to the root node of the tree, and position variable nodes connected to the first UCN at a second level corresponding to a child node of the root node in the tree. The LDPC decoder 133 may not position the UCN positioned at the root node at a lower level. Furthermore, the LDPC decoder 133 may position some of the check nodes connected to the variable nodes, which are positioned at the second level, at a third level. Some of the check nodes may indicate check nodes other than the UCN positioned at the level just above the second level, i.e. the first level, among the check nodes connected to the variable nodes positioned at the second level. In the same way, the LDPC decoder 133 may configure the tree until the length of the error path candidate reaches a third threshold d. The LDPC decoder 133 may configure a tree for each of the second to $N^{th}$ UCNs in the same manner. The specific method for configuring the tree will be described below with reference to FIG. 12.

In step S954, the LDPC decoder 133 may detect an error path candidate from the tree configured in step S952. The LDPC decoder 133 may detect variable nodes having an LLR greater than or equal to a fourth threshold value τ, among the variable nodes in the tree. Further, the LDPC decoder 133 may exclude paths including the variable nodes from the error path candidate. In accordance with an embodiment, the LDPC decoder 133 may exclude the paths including the variable nodes having an LLR greater than or equal to the fourth threshold value τ from the error path candidate. In various embodiments, the LDPC decoder 133 may determine the excluded paths, based on the characteristic that variable nodes have different LLRs depending on whether there is an error, and error variable nodes have a smaller LLR vector magnitude |LLR| than non-error variable nodes as described below with reference to FIG. 11.

In step S954, the LDPC decoder 133 may select an UCN from the tree. In various embodiments, the selected UCN may be different from the UCN positioned at the root node among the UCNs in the UCN set $\mathcal{C}_T$. Further, the LDPC decoder 133 may detect a path connecting the UCN positioned at the root node to the selected UCN as the error path candidate. In accordance with an embodiment, the LDPC decoder 133 may detect a path as the error path candidate. In various embodiments, the detected path may include variable nodes having an LLR vector magnitude |LLR| less than the fourth threshold value τ among paths connecting different UCNs in the UCN set $\mathcal{C}_T$.

Figure 11:
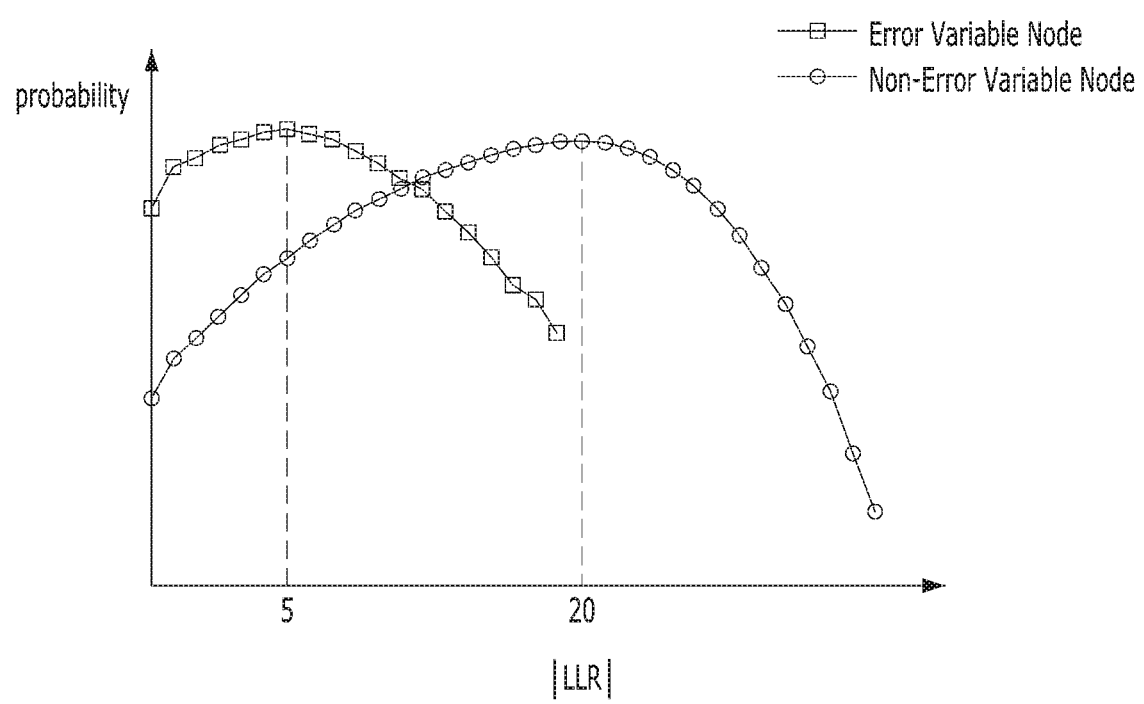
FIG. 11 is a graph illustrating LLR vector magnitudes of variable nodes depending on whether there is an error.

FIG. 11 is a graph illustrating the LLR vector magnitudes of the variable nodes depending on whether there is an error.

The two-dimensional graph illustrated in FIG. 11 may indicate distribution probabilities of error variable nodes and non-error variable nodes versus the LLR vector magnitude |LLR|. The graph illustrates a result of an experiment which was carried out according to a quantized min-sum algorithm (QMSA) in the Margulis LDPC codes, with the maximum iteration count $I_{max}$ set to 100 in the region where the SNR is 2.5 dB. The graph shows that an error variable node is highly likely to have an LLR vector magnitude |LLR| of 5, and a non-error variable node is highly likely to have an LLR vector magnitude |LLR| of 20. Furthermore, the two-dimensional graph shows that the error variable nodes are highly likely to have a lower LLR vector magnitude |LLR| than the non-error variable nodes. The LLR represents the log of a value, which is obtained by dividing the probability that the symbol of a variable node has a value of 1 by the probability that the symbol of the variable node has a value of 0. Therefore, the LLR vector magnitude |LLR| may decrease as a difference between the probability that the symbol of the variable node has a value of 1 and the probability that the symbol of the variable node has a value of 0 decreases. When the probability that the symbol of a variable node has a value of 1 is similar to the probability that the symbol of the variable node has a value of 0, the probability that an error will occur may increase. Thus, the LLR vector magnitudes |LLR| of the error variable nodes may exhibit a small average. Thus, in accordance with an embodiment, the LDPC decoder 133 may exclude paths from the error path candidate. In various embodiments, the excluded paths may include variable nodes having an LLR vector magnitude greater than or equal to the fourth threshold value τ among the variable nodes in the tree. Thus, the LDPC decoder 133 may configure the error path candidate with paths which are highly likely to be error paths.

Figure 12:
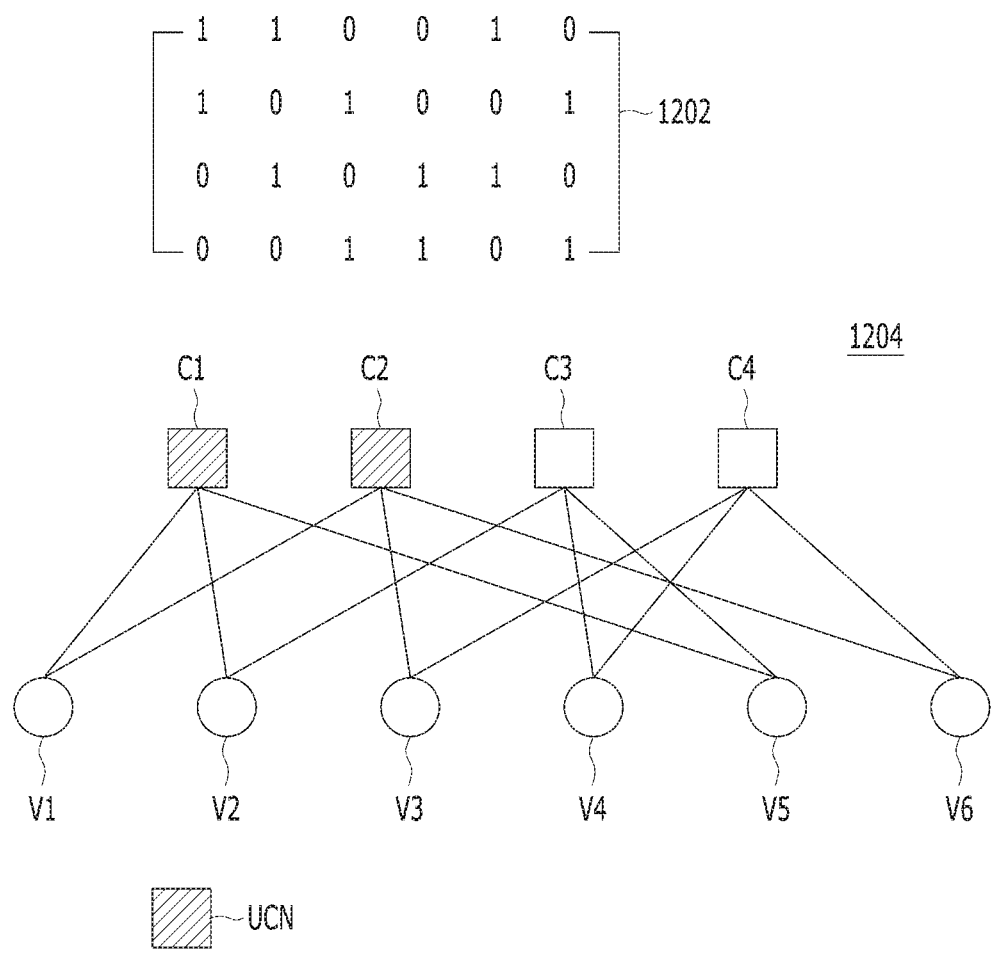
FIGS. 12 and 13 are diagrams illustrating a process of detecting an error path candidate in accordance with an embodiment.
Figure 13:
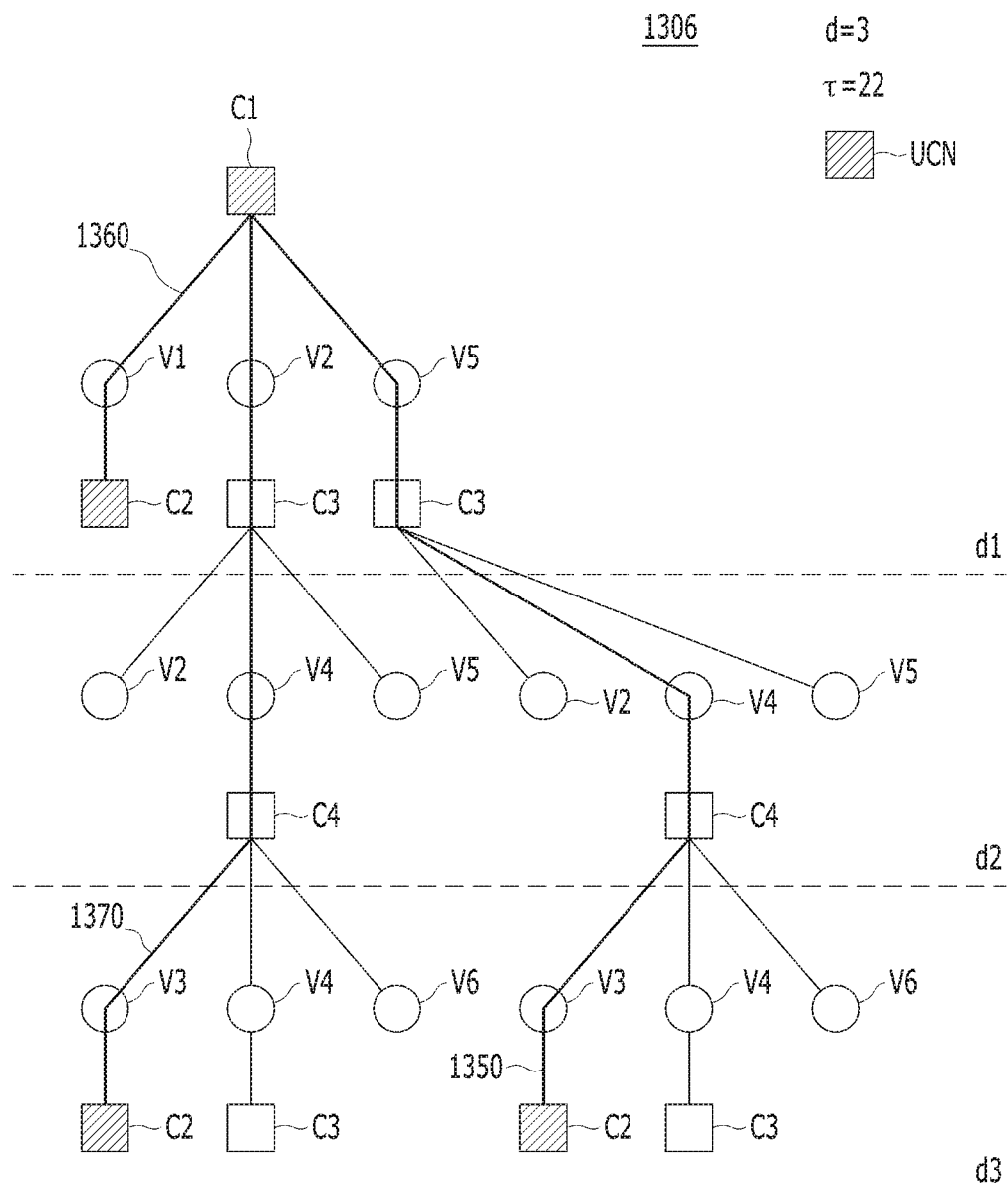

FIGS. 12 and 13 are diagrams illustrating the process of detecting the error path candidate in accordance with an embodiment.

FIG. 12 illustrates a parity check matrix 1202 and a Tanner graph 1204 corresponding to the parity check matrix 1202. By way of example, three variable nodes are connected to each of check nodes, and two check nodes are connected to each of the variable nodes.

The parity check matrix 1202 shows that the number of elements having a value of 1 in each row is 3, and the number of elements having a value of 1 in each column is 2. Since an element in the parity check matrix 1202 has a value of 1 when the corresponding variable node and the corresponding check node are connected to each other through an edge, each of the check nodes may be connected to three variable nodes, and each of the variable nodes may be connected to two check nodes.

The Tanner graph 1204 may correspond to the parity check matrix 1202. By way of example, the first and second check nodes are UCNs. The first to fourth rows of the parity check matrix 1202 may correspond to the first to fourth check nodes C1 to C4, respectively. The first to sixth columns may correspond to the first to sixth variable nodes V1 to V6, respectively.

A tree 1306 illustrated in FIG. 13 shows the case in which the first check node C1 on the Tanner graph 1204 is positioned at the root node. By way of example, the third threshold value d is 3 and the fourth threshold value is 22.

The LDPC decoder 133 may position the first check node C1 at the first level, and position the first, second and fifth variable nodes V1, V2 and V5 connected to the first check node C1 at the second level. The LDPC decoder 133 may position the check node C2 at the third level. The check node C2 corresponds to the check node, which is obtained by excluding the check node C1 positioned at the level just above the second level and the check node C1 positioned at the top level from the check nodes C1 and C2 connected to the first variable node V1. Furthermore, the LDPC decoder 133 may position the check node C3 at the third level. The check node C3 corresponds to the check node, which is obtained by excluding the check node C1 positioned at the level just above the second level and the check node C1 positioned at the top level from the check nodes C1 and C3 connected to the second variable node V2. In the same manner, the LDPC decoder 133 may configure the tree 1306 until the length of the error path candidate reaches the third threshold d.

The LDPC decoder 133 may exclude paths from the error path candidate. In various embodiments, the excluded paths include variable nodes having an LLR vector magnitude |LLR| greater than or equal to the fourth threshold value r among the variable nodes in the tree 1306. For example, since an LLR distribution table 1308 for the variable nodes shows that the LLR vector magnitude |LLR| of the fifth variable node V5 is 25 which is greater than the fourth threshold value τ of 22, the LDPC decoder 133 may exclude paths including the fifth variable node V5 from the error path candidate. Therefore, a path 1350 which includes the fifth variable node V5 and connects the first check node C1 to the second check node C2 may be excluded from the error path candidate, even though the path 1350 connects different UCNs and has a length less than or equal to the third threshold value d.

The LDPC decoder 133 may detect a path as the error path candidate. In various embodiments, the detected path connects the first check node C1 to the second check node C2 except the first check node C1 among paths other than the paths which are excluded based on the LLR vector magnitude |LLR| among the paths in the tree 1306. For example, the LDPC decoder 133 may detect a first path 1360 connecting the first check node C1 to the second check node C2 as the error path candidate, and designate the length of the detected first path 1360 as 1. Furthermore, the LDPC decoder 133 may detect a second path 1370 connecting the first check node C1 to the second check node C2 as the error path candidate, and designate the length of the detected second path 1370 as 3.

Referring back to FIG. 9, the LDPC decoder 133 may sort the error path candidates detected in step S906 in ascending order of the maximum LLR vector magnitudes $L_i$ in step S908. The LDPC decoder 133 may calculate the maximum value of the LLR vector magnitudes |LLR| of the variable nodes in each of the error path candidates as the maximum LLR vector magnitude $L_i$ for the error path candidate.

$$L_i = \max_{v_{j'} \in P_i} L_T(v_{j'}) \qquad \text{[Equation 1]}$$

Referring to Equation 1, the LDPC decoder 133 may calculate the maximum value of the LLR vector magnitudes $L_T(v_{j'})$ of variable nodes as the maximum LLR vector magnitude $L_i$. The variable nodes may be included in each of the error path candidates $P_i$ detected from the tree in which a $j^{th}$ UCN $c_j$ among the UCNs in the UCN set $\mathcal{C}_T$ is positioned at the root node.

The LDPC decoder 133 may calculate the maximum LLR vector magnitudes $L_i$ of the respective error path candidates. Further, the LDPC decoder 133 may sort the error path candidates in ascending order of the maximum LLR vector magnitudes $L_i$ as expressed by Equation 2 below. Equation 2 below is based on the supposition that $n_p$ error path candidates are included.

$$\mathcal{P} = (P_{x_1}, P_{x_2}, \ldots, P_{x_{n_p}}) \text{ where } L_{x_1} < L_{x_2} < \ldots < L_{x_{n_p}}$$

Figure 14:
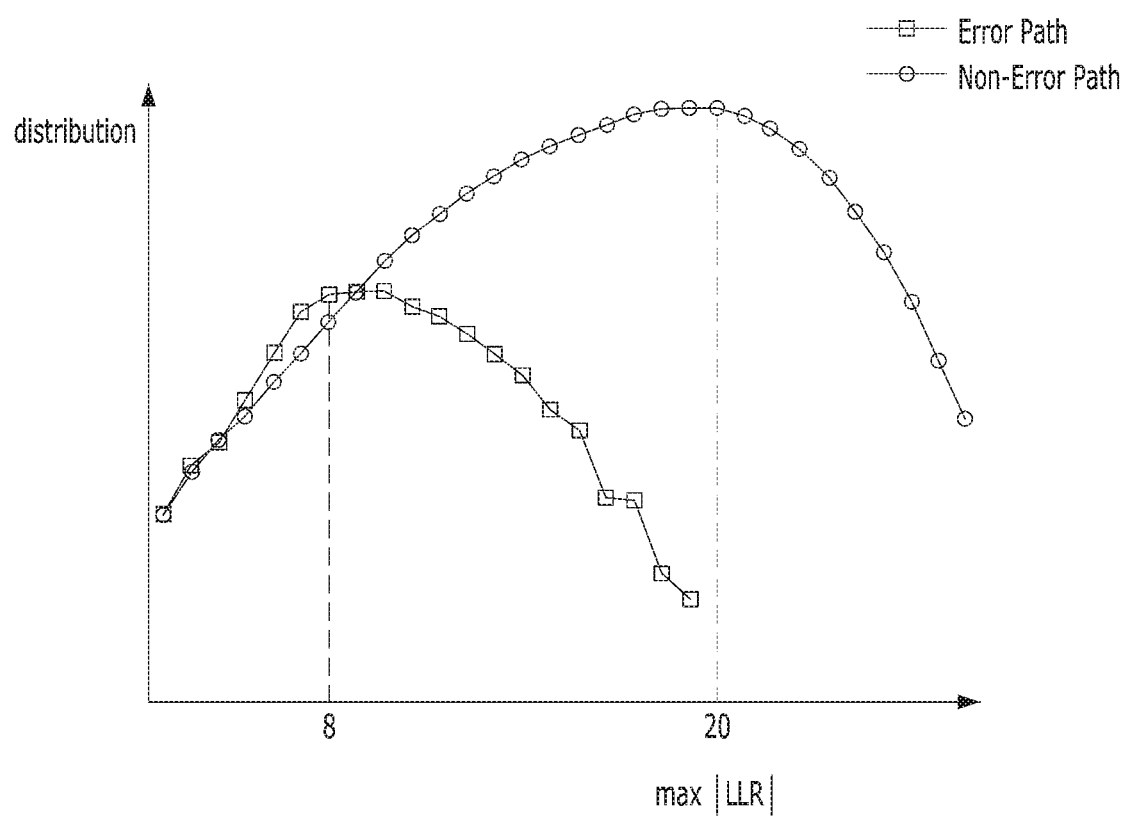
FIG. 14 is a graph illustrating distributions of error paths and non-error paths depending on the maximum LLR vector magnitudes.

FIG. 14 is a graph illustrating error paths and non-error paths depending on the maximum LLR vector magnitudes.

The two-dimensional graph illustrated in FIG. 14 shows distributions of error paths and non-error paths depending on the maximum LLR vector magnitude Max|LLR|. The two-dimensional graph shows that the largest number of non-error paths are distributed when the maximum LLR vector magnitude MAX|LLR| is 20, and the largest number of error paths are distributed when the maximum LLR vector magnitude MAX|LLR| is 8. Furthermore, the two-dimensional graph shows that the error paths are distributed on the left side of the x-axis in comparison to the non-error paths, which means that the average maximum LLR vector magnitude MAX|LLR| of the error paths is less than that of the non-error paths. Therefore, the LDPC decoder 133 in accordance with the present embodiment may sort the error path candidates in ascending order of the maximum LLR vector magnitudes MAX|LLR|, based on the fact that the probability that a path is an error path increases as the maximum LLR vector magnitude MAX|LLR| decreases. The LDPC decoder 133 may reset the symbol values and LLRs of the variable nodes in the error path candidates according to the order in which the error path candidates are sorted, and perform MP decoding, thereby more rapidly decoding the codeword.

Referring back to FIG. 9, the LDPC decoder 133 may update the symbol values and LLRs of the variable nodes in the error path candidates according to the order in which the error path candidates are sorted in step S908. Further, the LDPC decoder 133 may perform decoding according to the MP algorithm again, using the updated symbol values and LLRs, in step S910. For example, the LDPC decoder 133 may invert the symbol values of the variable nodes in the first error path candidate $P_{x_1}$, and reset the LLRs $y_v$ of the variable nodes to the maximum quantized value $\eta$ as expressed by Equation 3 below.

$$y \leftarrow y^{LLR} \quad \text{[Equation 3]}$$
$$y_v \leftarrow -\text{sign}(L_{T,v}) \cdot \eta, \text{ for } \forall v \in \mathcal{P}_{x_n}$$
$$\text{sign}(x) = \begin{cases} 1 & \text{if } x \geq 0, \\ -1 & \text{if } x < 0 \end{cases}$$

The LDPC decoder 133 may perform a re-decoding operation of performing decoding according to the MP algorithm over the maximum re-decoding iteration count $I_{max}^{(1)}$, after resetting the symbol values and LLRs of the variable nodes in the first error path candidate $P_{x_1}$. The maximum re-decoding iteration count $I_{max}^{(1)}$ may be less than the maximum iteration count $I_{max}$) of the first decoding. When the decoding succeeds within the maximum re-decoding iteration count $I_{max}^{(1)}$, the LDPC decoder 133 may output decision values $\hat{u}_n$ of the variable nodes. When the decoding does not succeed within the maximum re-decoding iteration count $I_{max}^{(1)}$, the LDPC decoder 133 may repeatedly perform the re-decoding operation on the second to $n_p^{th}$ error path candidates $P_{x_2}$ to $$P_{x_{n_p}},$$

until the decoding succeeds.

Figure 15:
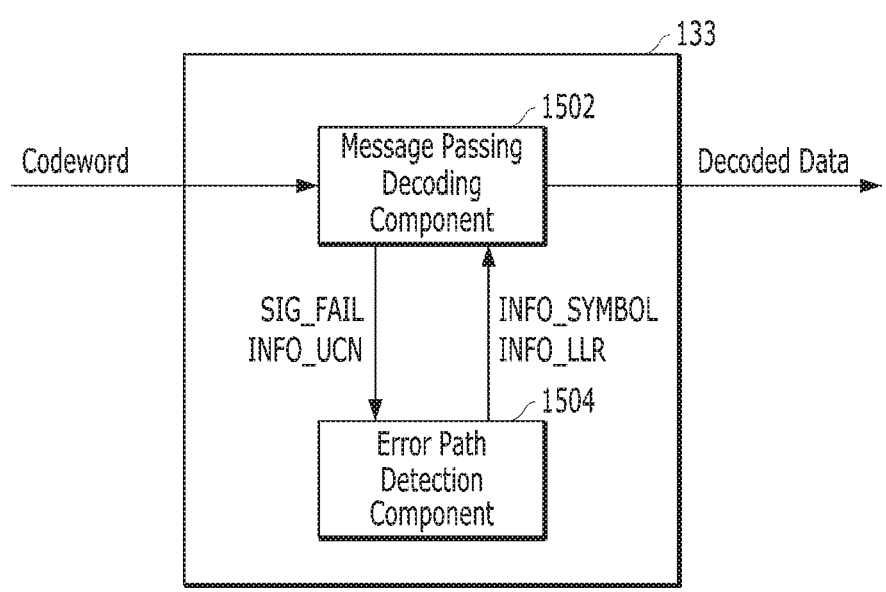
FIG. 15 is a detailed block diagram illustrating an LDPC decoder in accordance with an embodiment.

FIG. 15 is a detailed block diagram illustrating an LDPC decoder in accordance with an embodiment. For clarity, FIG. 15 simply illustrates only components related to the present embodiment in the semiconductor memory system 10 of FIG. 3.

Referring to FIG. 15, the LDPC decoder 133 may include a message passing decoding component 1502 and an error path detection component 1504.

The message passing decoding component 1502 may decode a codeword stored as encoded data in the semiconductor memory device 200 according to the MP algorithm, and output the decoded data. The message passing decoding component 1502 may perform first decoding based on the symbol values and LLR vectors of the respective variable nodes provided from a channel. The message passing decoding component 1502 may set the maximum quantized value to the first threshold value $\eta$. The message passing decoding component 1502 may perform the first decoding in which a cycle composed of a variable node update operation, a check node update operation and a syndrome check operation is repeatedly performed within an iteration count $I_{max}$. When the codeword is successfully decoded within the iteration count $I_{max}$, the message passing decoding component 1502 may end the first decoding, and output original data generated by decoding the codeword. The message passing decoding component 1502 may measure the number of UCNs whenever the cycle is repeated, and separately store the measured number of UCNs as UCN information INFO_UCN. When the codeword is not successfully decoded within the iteration count $I_{max}$, the message passing decoding component 1502 may end the first decoding, and provide a fail signal SIG_FAIL and the UCN information INFO_UCN to the error path detection component 1504.

The error path detection component 1504 may perform an operation of searching for an error path in response to the provided fail signal SIG_FAIL. The error path may indicate a path including only error variable nodes among paths connecting a first UCN to a second UCN, when there is an error caused by a trapping set. The first and second UCNs may be different UCNs. When the provided UCN information INFO_UCN indicates that the minimum value of the numbers of UCNs is N less than or equal to a second threshold value $\tau_u$, the error path detection component 1504 may define a set of UCNs for the minimum value as a UCN set $\mathcal{C}_{\overline{T}}$. The minimum value of the numbers of UCNs may be stored in the respective cycles while the first decoding is performed. The error path detection component 1504 may separately store information on the first to $n^{th}$ UCNs in the UCN set $\mathcal{C}_{\overline{T}}$.

The error path detection component 1504 may search for an error path by repeatedly performing an operation of configuring a tree in which each of the UCNs in the UCN set $\mathcal{C}_{\overline{T}}$ is set to the root node and an operation of detecting an error path candidate. Specifically, the error path detection component 1504 may position the first UCN in the UCN set $\mathcal{C}_{\overline{T}}$ at a first level corresponding to the root node of the tree, and position variable nodes connected to the first UCN at a second level of the tree. The error path detection component 1504 may not position the UCN positioned at the root node at a lower level. The error path detection component 1504 may position some of the check nodes connected to the variable nodes, which are positioned at the second level, at a third level. At this time, some of the check nodes may indicate check nodes other than the UCN positioned at the level just above the second level, i.e. the first level, among the check nodes connected to the variable nodes positioned at the second level. In the same way, the error path detection component 1504 may configure the tree until the length of the error path candidate reaches a third threshold d. The length of the error path may indicate the number of error variable nodes present in the error path. The error path detection component 1504 may configure a tree for each of the second to $N^{th}$ UCNs in the same manner, and the method for configuring the tree has been described above with reference to FIG. 13.

The error path detection component 1504 may detect an error path candidate from the configured tree. As described above with reference to FIG. 13, the error path detection component 1504 may detect variable nodes having an LLR vector magnitude greater than or equal to the fourth threshold value among the variable nodes in the tree. Further, the error path detection component 1504 may exclude paths including the variable nodes from the error path candidate. In accordance with an embodiment, based on the characteristic that variable nodes have different LLRs depending on whether there is an error and error variable nodes have a smaller LLR vector magnitude than non-error variable nodes, the error path detection component 1504 may exclude a path from the error path candidate. In various embodiments, the excluded path includes variable nodes having an LLR vector magnitude greater than or equal to the fourth threshold value $\tau$.

The error path detection component 1504 may select a second UCN from the tree. In various embodiments, the second UCN may be different from the first UCN positioned at the root node among the UCNs included in the UCN set $\mathcal{E}_\mathcal{T}$. Further, the error path detection component 1504 may detect a path connecting the first UCN positioned at the root node to the selected second UCN as the error path candidate. In accordance with an embodiment, the error path detection component 1504 may detect a path as the error path candidate. In various embodiments, the detected path includes variable nodes having an LLR vector magnitude less than the fourth threshold value $\tau$ among paths connecting different UCNs in the UCN set $\mathcal{E}_\mathcal{T}$.

The error path detection component 1504 may sort the detected error path candidates in ascending order of the maximum LLR vector magnitudes $L_i$. The error path detection component 1504 may calculate the maximum value of the LLR vector magnitudes for the variable nodes in each of the detected error path candidates as the maximum LLR vector magnitude $L_i$ for the error path candidate as expressed by Equation 1. The error path detection component 1504 may calculate the maximum value of the LLR vector magnitudes $L_T(v_j)$ of the variable nodes as the maximum LLR vector magnitude $L_i$. In various embodiments, the variable nodes may be included in each of the error path candidates $\mathcal{P}_i$ detected from the tree in which a $j^{th}$ UCN $c_j$ of the UCNs in the UCN set $\mathcal{E}_\mathcal{T}$ is positioned at the root node. The error path detection component 1504 may calculate the maximum LLR vector magnitude $L_i$ for each of the error path candidates. Further, the error path detection component 1504 may sort the error path candidates in ascending order of the maximum LLR vector magnitudes $L_i$ as expressed by Equation 2.

The error path detection component 1504 may update the symbol values and LLRs of the variable nodes in the error path candidates according to the order in which the error path candidates are sorted. Further, the error path detection component 1504 may provide the message passing decoding component 1502 with information INFO_SYMBOL on the updated symbol values and information INFO_LLR on the updated LLRs. For example, the error path detection component 1504 may perform the update operation by inverting the symbol values of the variable nodes in the first error path candidate $P_{x_1}$ and resetting the LLRs $y_v$ of the variable nodes to the maximum quantized value $\eta$ as expressed by Equation 3.

The message passing decoding component 1502 may perform decoding according to the MP algorithm again, based on the provided information INFO_SYMBOL on the symbol values and the provided information INFO_LLR on the LLRs. The message passing decoding component 1502 may perform a re-decoding operation of performing decoding according to the MP algorithm over the maximum re-decoding iteration count $I_{max}^{(1)}$, after the symbol values and LLRs of the variable nodes in the first error path candidate $P_{x_1}$ are reset. The maximum re-decoding iteration count $I_{max}^{(1)}$ may be less than the maximum iteration count $I_{max}$ of the first decoding. When the decoding succeeds over the maximum re-decoding iteration count $I_{max}^{(1)}$, the message passing decoding component 1502 may output decision values $\hat{u}_n$ of the variable nodes. When the decoding does not succeed within the maximum re-decoding iteration count $I_{max}^{(1)}$, the message passing decoding component 1502 may repeatedly perform the re-decoding operation on the second to $n_p^{th}$ error path candidates $P_{x_2}$ to $$P_{x_{n_p}},$$

until decoding succeeds.

Figure 16:
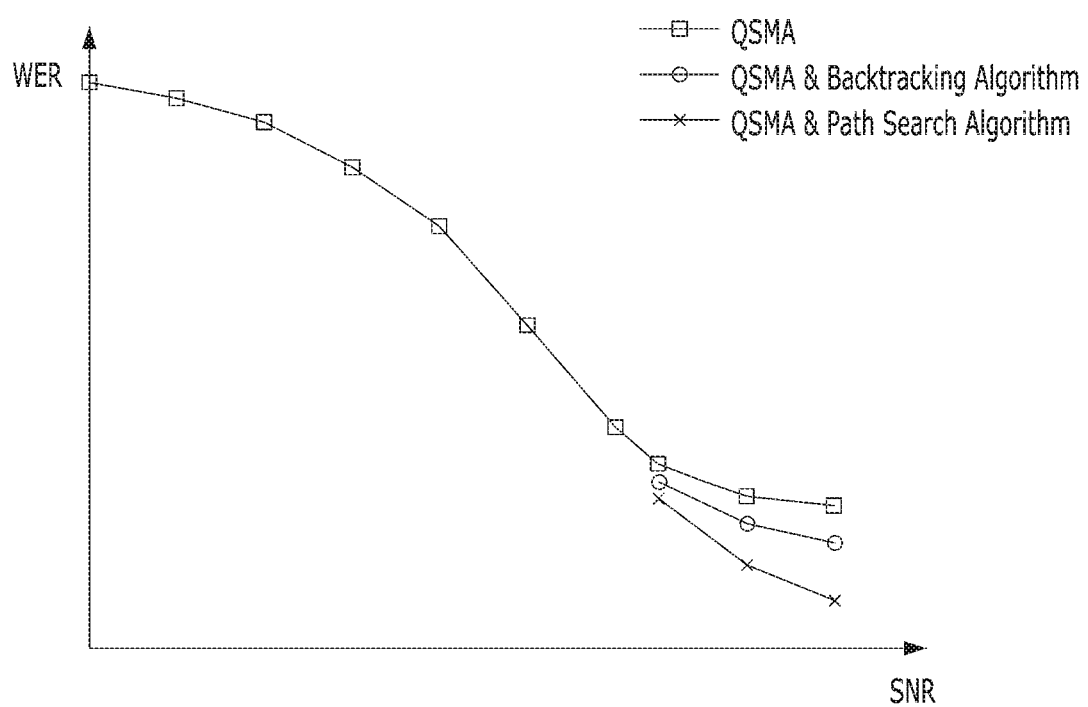
FIG. 16 is a graph illustrating a result of an operation simulation of the LDPC decoder in accordance with an embodiment.

FIG. 16 is a graph illustrating a result of an operation simulation of the LDPC decoder 133 in accordance with an embodiment.

The graph illustrated in FIG. 16 shows a result obtained by comparing the performances of a general QMSA in the Margulis LDPC codes, an algorithm obtained by applying backtracking to the QMSA, and an algorithm to which the path search in accordance with the present embodiment is applied. The x-axis of the graph may indicate the SNR, and the y-axis of the graph may indicate the WER. The WER of the algorithm, to which the path search in accordance with the present embodiment is applied, may be significantly reduced at a high SNR, compared to the general QMSA and the algorithm obtained by applying backtracking to the QMSA. Therefore, the LDPC decoder 133 employing the algorithm to which the path search in accordance with the present embodiment is applied may exhibit more improved decoding performance in the error floor region than in the related art.

Hereinafter, with reference to FIG. 17 to FIG. 22, memory systems including decoder 133 are described.

Figure 17:
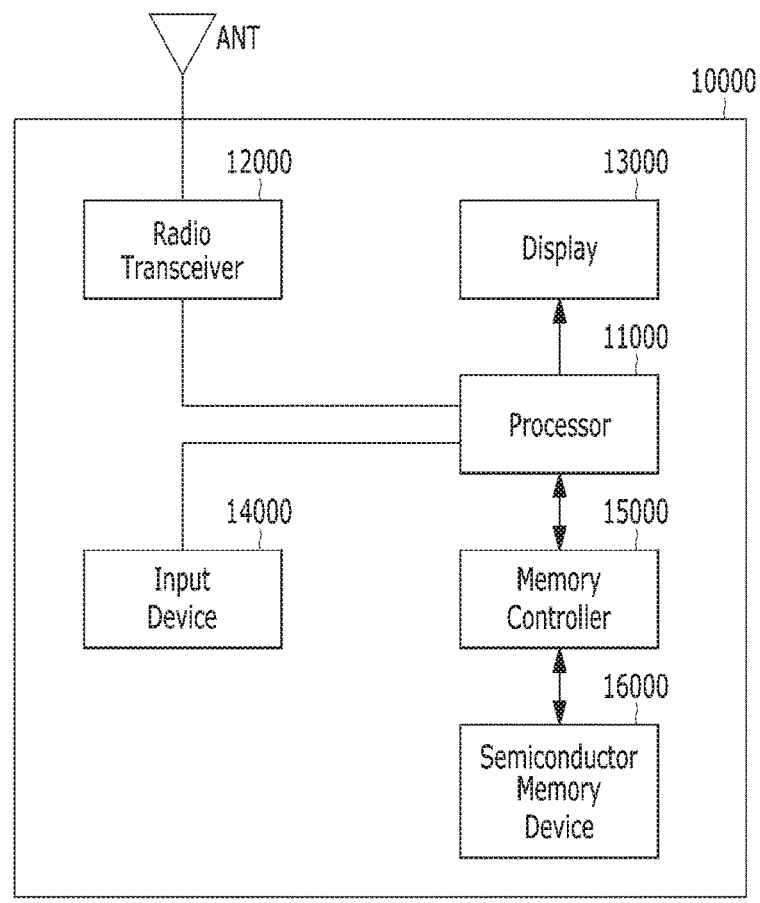
FIG. 17 is a block diagram schematically illustrating an electronic device including a semiconductor memory system in accordance with an embodiment of the present invention.

FIG. 17 is a block diagram schematically illustrating an electronic device 10000 including a memory controller 15000 and a semiconductor memory device 16000 in accordance with an embodiment of the present invention.

Referring to FIG. 17, the electronic device 10000 such as a cellular phone, a smart phone, or a tablet PC may include the semiconductor memory device 16000 implemented by a flash memory device and the memory controller 15000 to control the semiconductor memory device 16000.

The semiconductor memory device 16000 may correspond to the semiconductor memory device 200 described above with reference to FIGS. 3 to 4A. The semiconductor memory device 16000 may store random data.

The memory controller 15000 may correspond to the memory controller 100 described with reference to FIGS. 3 to 4A. The memory controller 15000 may be controlled by a processor 11000 which controls overall operations of the electronic device 10000.

Data stored in the semiconductor memory device 16000 may be displayed through a display 13000 under the control of the memory controller 15000. The memory controller 15000 operates under the control of the processor 11000.

A radio transceiver 12000 may receive and output a radio signal through an antenna ANT. For example, the radio transceiver 12000 may convert the received radio signal from the antenna ANT into a signal to be processed by the processor 11000. Thus, the processor 11000 may process the converted signal from the radio transceiver 12000, and may store the processed signal at the semiconductor memory device 16000. Otherwise, the processor 11000 may display the processed signal through the display 13000.

The radio transceiver 12000 may convert a signal from the processor 11000 into a radio signal, and may output the converted radio signal to an external device through the antenna ANT.

An input device 14000 may receive a control signal for controlling operations of the processor 11000 or data to be processed by the processor 11000, and may be implemented by a pointing device such as a touch pad or a computer mouse, a key pad, or a keyboard.

The processor 11000 may control the display 13000 such that the data from the semiconductor memory device 16000, the radio signal from the radio transceiver 12000 or the data from the input device 14000 is displayed through the display 13000.

Figure 18:
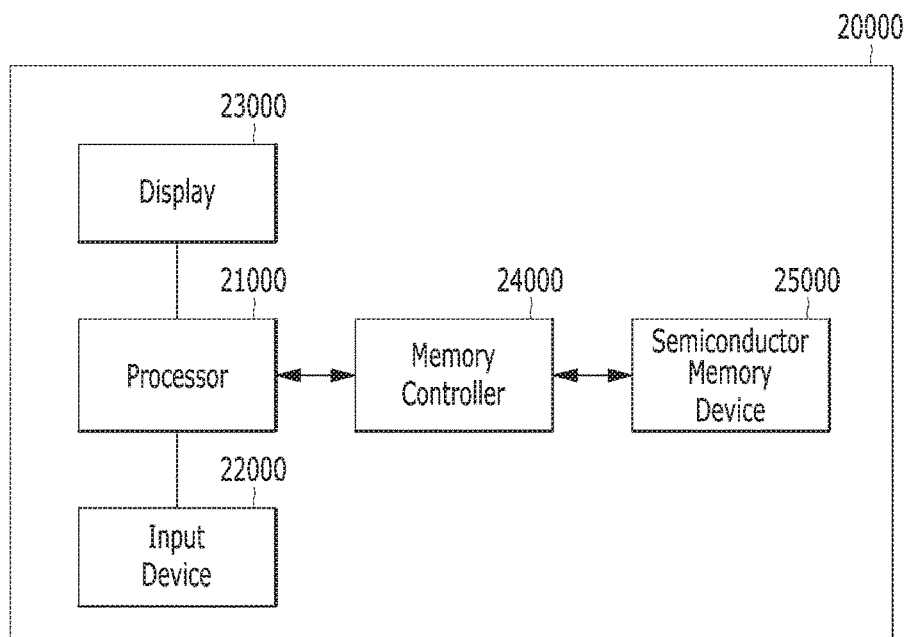
FIG. 18 is a block diagram schematically illustrating an electronic device including a semiconductor memory system in accordance with an embodiment of the present invention.

FIG. 18 is a block diagram schematically illustrating an electronic device 20000 including a memory controller 24000 and a semiconductor memory device 25000 in accordance with an embodiment of the present invention.

The memory controller 24000 and the semiconductor memory device 25000 may correspond to the memory controller 100 and the semiconductor memory device 200 described with reference to FIGS. 3 to 4A, respectively.

Referring to FIG. 18, the electronic device 20000 may be implemented by a data processing device such as a personal computer (PC), a tablet computer, a net-book, an e-reader, a personal digital assistant (PDA), a portable multimedia player (PMP), an MP3 player, or an MP4 player. The electronic device 20000 may include the semiconductor memory device 25000, e.g., the flash memory device, and the memory controller 24000 to control operations of the semiconductor memory device 25000.

The electronic device 20000 may include a processor 21000 to control overall operations of the electronic device 20000. The memory controller 24000 may be controlled by the processor 21000.

The processor 21000 may display data stored in the semiconductor memory device 25000 through a display 23000 according to an input signal from an input device 22000. For example, the input device 22000 may be implemented by a pointing device such as a touch pad or a computer mouse, a key pad, or a keyboard.

Figure 19:
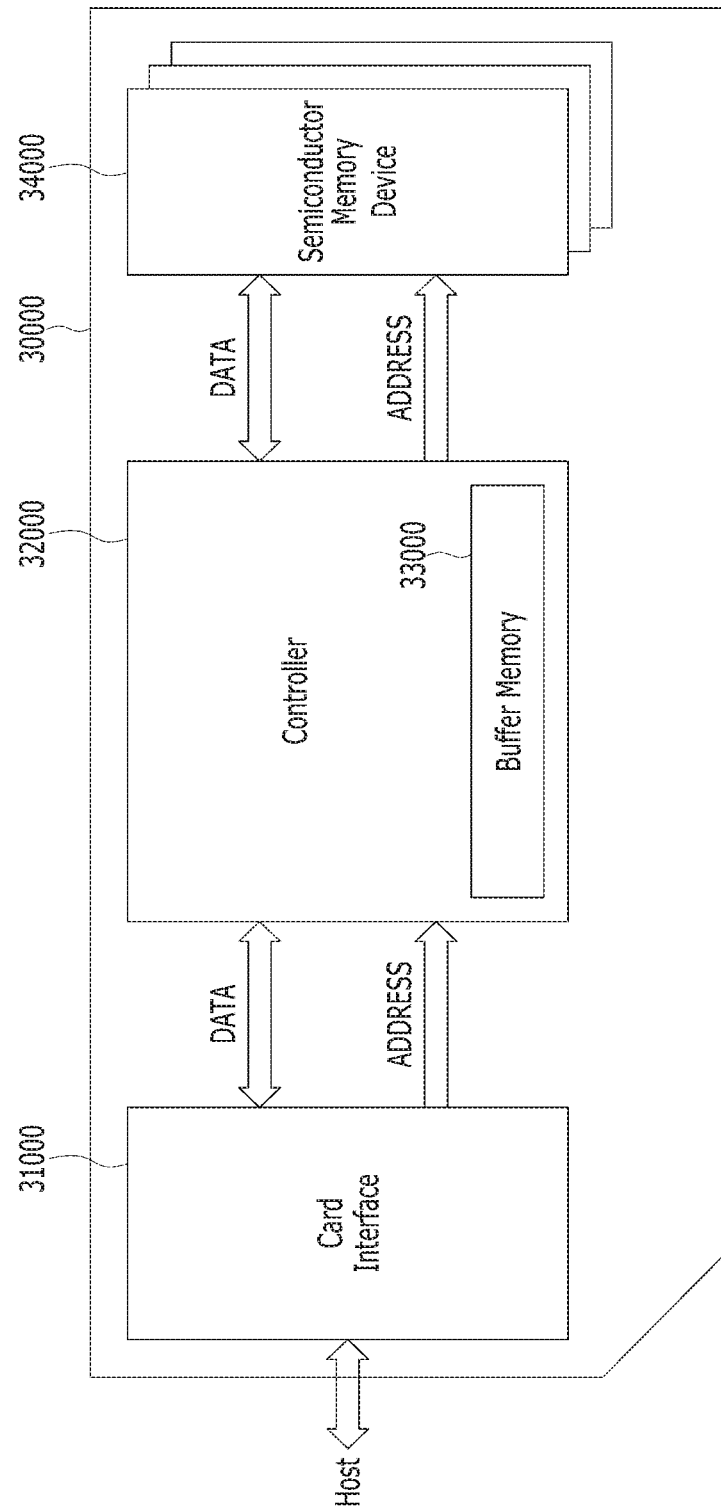
FIG. 19 is a block diagram schematically illustrating an electronic device including a semiconductor memory system in accordance with an embodiment of the present invention.

FIG. 19 is a block diagram schematically illustrating an electronic device 30000 including a controller 32000 and a semiconductor memory device 34000 in accordance with an embodiment of the present invention.

The controller 32000 and the semiconductor memory device 34000 may correspond to the memory controller 100 and the semiconductor memory device 200 described with reference to FIGS. 3 to 4A, respectively.

Referring to FIG. 19, the electronic device 30000 may include a card interface 31000, the controller 32000, and the semiconductor memory device 34000, for example, a flash memory device.

The electronic device 30000 may exchange data with a host through the card interface 31000. The card interface 31000 may be a secure digital (SD) card interface or a multi-media card (MMC) interface, although the scope of the present invention is not limited by the type of interface. The card interface 31000 may interface the host and the controller 32000 according to a communication protocol of the host capable of communicating with the electronic device 30000.

The controller 32000 may control an overall operation of the electronic device 30000, and may control data exchange between the card interface 31000 and the semiconductor memory device 34000. A buffer memory 33000 of the controller 32000 may buffer data transferred between the card interface 31000 and the semiconductor memory device 34000.

The controller 32000 may be coupled with the card interface 31000 and the semiconductor memory device 34000 through a data bus DATA and an address bus ADDRESS. In accordance with an embodiment, the controller 32000 may receive an address of data, which is to be read or written, from the card interface 31000, through the address bus ADDRESS, and may send it to the semiconductor memory device 34000. Further, the controller 32000 may receive or transfer data to be read or written through the data bus DATA connected with the card interface 31000 or the semiconductor memory device 34000.

When the electronic device 30000 is connected with the host such as a PC, a tablet PC, a digital camera, a digital audio player, a mobile phone, console video game hardware or a digital set-top box, the host may exchange data with the semiconductor memory device 34000 through the card interface 31000 and the controller 32000.

Figure 20:
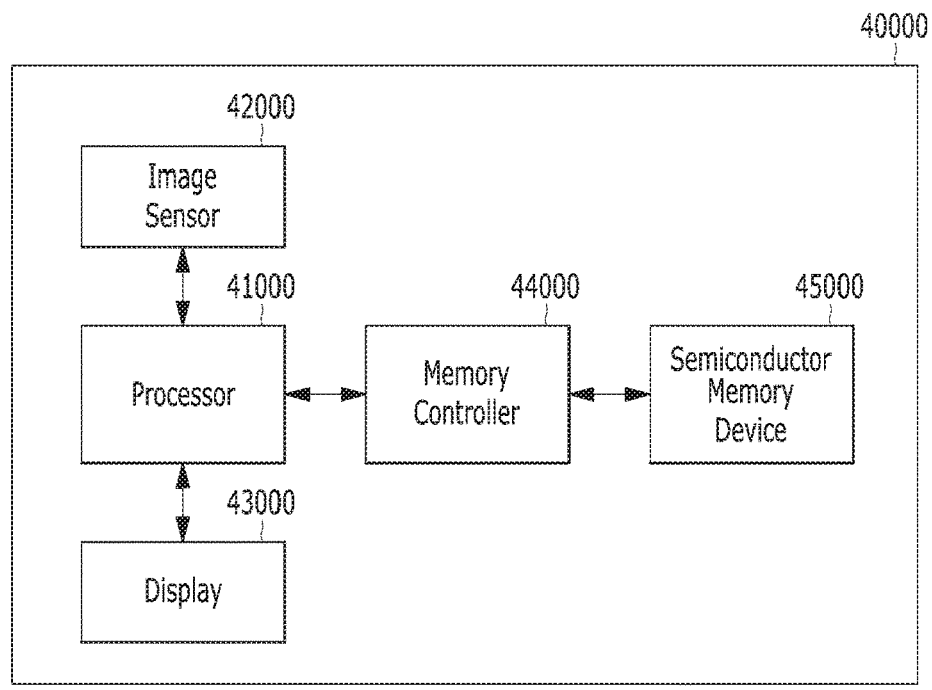
FIG. 20 is a block diagram schematically illustrating an electronic device including a semiconductor memory system in accordance with an embodiment of the present invention.

FIG. 20 is a block diagram schematically illustrating an electronic device 40000 including a memory controller 44000 and a semiconductor memory device 45000 in accordance with an embodiment of the present invention.

The memory controller 44000 and the semiconductor memory device 45000 may correspond to the memory controller 100 and the semiconductor memory device 200 described with reference to FIGS. 3 to 4A, respectively.

Referring to FIG. 20, the electronic device 40000 may include the semiconductor memory device 45000, e.g., the flash memory device, the memory controller 44000 to control a data processing operation of the semiconductor memory device 45000, and a processor 41000 to control overall operations of the electronic device 40000.

Further, an image sensor 42000 of the electronic device 40000 may convert an optical signal into a digital signal, and the converted digital signal may be stored in the semiconductor memory device 45000 under the control of the processor 41000. Otherwise, the converted digital signal may be displayed through a display 43000 under the control of the processor 41000.

Figure 21:
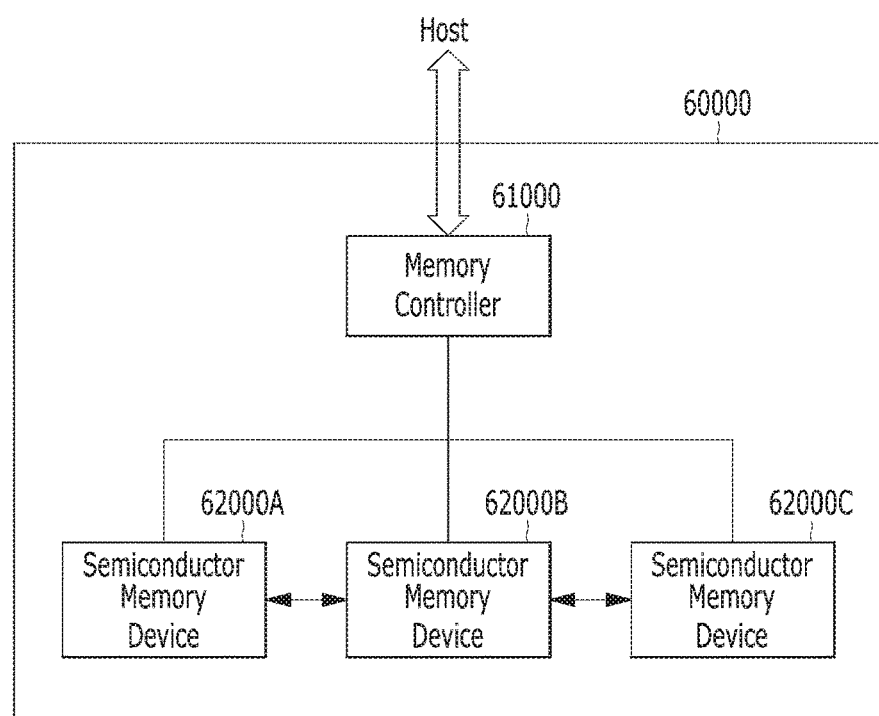
FIG. 21 is a block diagram schematically illustrating an electronic device including a semiconductor memory system in accordance with another embodiment of the present invention.

FIG. 21 is a block diagram schematically illustrating an electronic device 60000 including a memory controller 61000 and semiconductor memory devices 62000A, 62000B, and 62000C in accordance with an embodiment of the present invention.

The memory controller 61000 and each of the semiconductor memory devices 62000A, 62000B, and 62000C may correspond to the memory controller 100 and the semiconductor memory device 200 described with reference to FIGS. 3 to 4A, respectively.

Referring to FIG. 21, the electronic device 60000 may be implemented by a data storage device such as a solid state drive (SSD).

The electronic device 60000 may include the plurality of semiconductor memory devices 62000A, 62000B, and 62000C and the memory controller 61000 to control a data processing operation of each of the semiconductor memory devices 62000A, 62000B, and 62000C.

The electronic device 60000 may be implemented by a memory system or a memory module.

For example, the memory controller 61000 may be implemented outside or inside the electronic device 60000.

Figure 22:
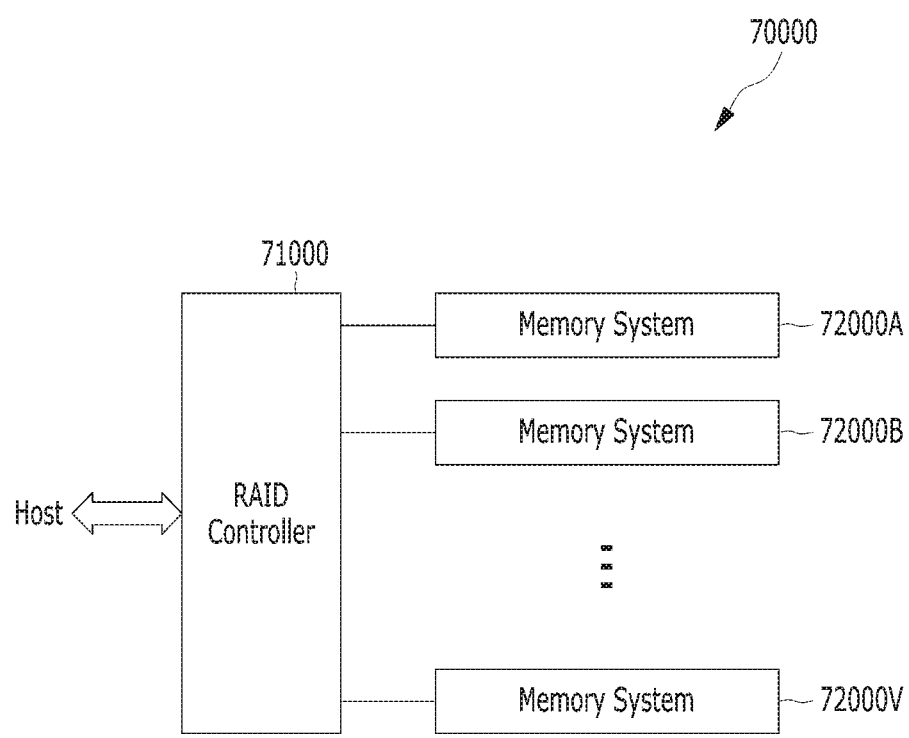
FIG. 22 is a block diagram of a data processing system including the electronic device shown in FIG. 21.

FIG. 22 is a block diagram illustrating a data processing system 70000 including the electronic device 6000 described with reference to FIG. 21.

Referring to FIGS. 21 and 22, the data storage device 70000 may be implemented by a redundant array of independent disks (RAID) system. The data storage device 70000 may include a RAID controller 71000 and a plurality of memory systems 72000A to 72000V, where A represents a first memory system and V represents a Vth memory system, V being a natural number greater than 1.

Each of the memory systems 72000A to 72000V may correspond to the electronic device 60000 described with reference to FIG. 21. The memory systems 72000A to 72000V may form a RAID array. The data storage device 70000 may be implemented by an SSD.

During a program operation, the RAID controller 71000 may output program data, which is output from a host, to one of the memory systems 72000A to 72000V according to one selected from a plurality of RAID levels based on RAID level information output from the host.

During a read operation, the RAID controller 71000 may transfer data, which is read from one of the memory systems 72000A to 72000N, to the host according to one of the RAID levels based on the RAID level information output from the host.

In accordance with embodiments, the LDPC decoder may sort the error path candidates in ascending order of the LLR vector magnitudes of the variable nodes in the respective error path candidates. The LDCP decoder may sequentially reset the symbol values and LLRs of the variable nodes in the error path candidates according to the order in which the error path candidates are sorted, and perform LDPC decoding based on the reset symbol values and LLRs, thereby improving the LDPC decoding performance in the error floor region.

Although various embodiments have been illustrated and described, it will be apparent to those skilled in the art in light of the present disclosure that various changes and modifications may be made without departing from the spirit and scope of the invention as defined in the following claims.

What is claimed is:

1. A semiconductor memory system comprising:
a semiconductor memory device suitable for storing a codeword including encoded data; and
a low density parity check (LDPC) decoder suitable for decoding the codeword to generate decoded data by receiving the codeword from the semiconductor memory device,
wherein the LDPC decoder comprises:
a message passing decoding component suitable for:
performing a first decoding operation of decoding the codeword up to a maximum number of iterations, and
calculating a minimum value among numbers of unsatisfied check nodes (UCNs), which are measured in each iteration; and
an error path detection component suitable for:
detecting error path candidates using a tree in which each of UCNs corresponding to the minimum value is set to a root node, when the first decoding operation fails and the minimum value is less than or equal to a second threshold value,
sorting the error path candidates in ascending order of maximum log likelihood ratios (LLRs),
resetting symbol values and LLRs of variable nodes in the error path candidates according to the order in which the error path candidates are sorted, and
providing the message passing decoding component with information on the reset symbol values and LLRs,
wherein the message passing decoding component performs a second decoding operation up to a maximum number of re-decoding iterations, based on the provided information on the reset symbol values and LLRs.

2. The semiconductor memory system of claim 1, wherein the error path detection component performs a variable node connection operation of positioning variable nodes, which are connected to a check node at a first level of the tree, at a second level of the tree and a check node connection operation of positioning check nodes at a third level of the tree, the check nodes at the third level indicating check nodes other than a victim UCN among check nodes connected to each of the variable nodes at the second level, and performs the variable node connection operation and the check node connection operation on child nodes until a value of a corresponding level reaches a third threshold value.

3. The semiconductor memory system of claim 2, wherein the victim UCN for each of the variable nodes includes a UCN positioned at the root node.

4. The semiconductor memory system of claim 2, wherein the victim UCN for each of the variable nodes includes, among check nodes connected to each of the variable nodes, check nodes positioned at an upper level adjacent to a level, where the variable nodes are positioned.

5. The semiconductor memory system of claim 2, wherein the error path detection component detects paths as the error path candidates from the tree, the paths indicating paths other than a path which includes variable nodes having an LLR vector magnitude greater than or equal to a fourth threshold value, among paths connecting a first UCN at the root node to second UCNs at low levels.

6. The semiconductor memory system of claim 5, wherein the first UCN is different from the second UCN.

7. The semiconductor memory system of claim 1, wherein the error path detection component resets the symbol values of the variable nodes in the error path candidates by inverting the symbol values.

8. The semiconductor memory system of claim 1, wherein the error path detection component resets the LLRs of the variable nodes in the error path candidates to the maximum quantized value.

9. The semiconductor memory system of claim 8, wherein the error path detection component sets the maximum quantized value to a first threshold value, the maximum quantized value indicating the maximum value of LLRs which the respective variable nodes have at a first decoding point.

10. The semiconductor memory system of claim 1, wherein the maximum number of re-decoding iterations is less than the maximum number of iterations.

11. An operating method of a semiconductor memory system, comprising:
performing a first decoding operation of decoding a codeword up to a maximum number of iterations;

calculating a minimum value among the numbers of unsatisfied check nodes (UCNs), which are measured in each iteration;

detecting error path candidates using a tree in which each of UCNs corresponding to the minimum value is set to a root node, when the first decoding operation fails and the minimum value is less than or equal to a second threshold value;

sorting the error path candidates in ascending order of maximum log likelihood ratios (LLRs);

resetting the symbol values and LLRs of variable nodes in the error path candidates according to the order in which the error path candidates are sorted; and performing decoding again up to a maximum number of re-decoding iterations, based on the reset symbol values and LLRs of the variable nodes, whenever the symbol values and the LLRs are reset.

12. The operating method of claim 11, wherein the detecting of the error path candidates comprises performing a variable node connection operation of positioning variable nodes, which are connected to a check node at a first level of the tree, at a second level of the tree and performing a check node connection operation of positioning check nodes at a third level of the tree, the check nodes at the third level indicating check nodes other than a victim UCN among check nodes connected to each of the variable nodes at the second level, and performing the variable node connection operation and the check node connection operation on child nodes until a value of a corresponding level reaches a third threshold value.

13. The operating method of claim 12, wherein the victim UCN for each of the variable nodes includes a UCN positioned at the root node.

14. The operating method of claim 12, wherein the victim UCN for each of the variable nodes includes, among check nodes connected to each of the variable nodes, check nodes positioned at an upper level adjacent to a level, where the variable nodes are positioned.

15. The operating method of claim 12, wherein the detecting of the error path candidates comprises detecting paths as the error path candidates from the tree, the paths indicating paths other than a path which includes variable nodes having an LLR vector magnitude greater than or equal to a fourth threshold value, among paths connecting a first UCN at the root node to second UCNs at low levels.

16. The operating method of claim 15, wherein the first UCN is different from the second UCN.

17. The operating method of claim 11, wherein the resetting of the symbol values and LLRs comprises resetting the symbol values of the variable nodes in the error path candidates by inverting the symbol values.

18. The operating method of claim 11, wherein the resetting of the symbol values and LLRs comprises resetting the LLRs of the variable nodes in the error path candidates to the maximum quantized value.

19. The operating method of claim 18, wherein the resetting of the symbol values and LLRs comprises setting the maximum quantized value to a first threshold value, the maximum quantized value indicating the maximum value of LLRs which the respective variable nodes have at a first decoding point.

20. The operating method of claim 11, wherein the maximum number of re-decoding iterations is less than the maximum number of iterations.

* * * * *